(12) United States Patent
Tada et al.

(10) Patent No.: US 7,265,740 B2
(45) Date of Patent: Sep. 4, 2007

(54) SUPPRESSION OF LEAKAGE CURRENT IN IMAGE ACQUISITION

(75) Inventors: Masahiro Tada, Fukaya (JP); Takashi Nakamura, Kumagaya (JP); Norio Tada, Kumagaya (JP); Masahiro Yoshida, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 621 days.

(21) Appl. No.: 10/635,509

(22) Filed: Aug. 7, 2003

(65) Prior Publication Data
US 2004/0043676 A1 Mar. 4, 2004

(30) Foreign Application Priority Data
Aug. 30, 2002 (JP) ............................. 2002-254851
Sep. 26, 2002 (JP) ............................. 2002-281665

(51) Int. Cl.
G09G 3/36 (2006.01)

(52) U.S. Cl. ..................... 345/91; 438/149; 257/292

(58) Field of Classification Search .............. 257/357, 257/290, 292, E27.112; 439/894; 345/90–91; 348/294; 438/149, 151, 162
See application file for complete search history.

(56) References Cited

U.S. PATENT DOCUMENTS

| 5,021,694 A | * | 6/1991 | Toshiro et al. ............. 327/438 |
| 5,202,573 A | * | 4/1993 | Shirai ....................... 257/140 |
| 5,596,217 A | * | 1/1997 | Yamaoka et al. ........... 257/367 |
| 6,524,893 B2 | * | 2/2003 | Kawazoe et al. .......... 438/133 |
| 2002/0012057 A1 | | 1/2002 | Kimura | |
| 2004/0043676 A1 | | 3/2004 | Tada et al. | |

FOREIGN PATENT DOCUMENTS

| EP | 1 122 792 A2 | 8/2001 |
| JP | 2959682 | 7/1999 |
| JP | 2001-292276 | 10/2001 |
| JP | 2001-339640 | 12/2001 |
| WO | WO 02/065752 A1 | 8/2002 |

OTHER PUBLICATIONS

U.S. Appl. No. 10/924,940, filed Aug. 25, 2004, Nakamura et al.

* cited by examiner

*Primary Examiner*—Richard Hjerpe
*Assistant Examiner*—Abbas Abdulselam
(74) *Attorney, Agent, or Firm*—Oblon, Spivak, McClelland, Maier & Neustadt, P.C.

(57) ABSTRACT

In a manufacturing process of a display device, hydrogenation in an I layer of photodiodes D1 and D2 is progressed less than that in a channel portion of a pixel TFT, and a defect density due to dangling bonds not terminated in the I layer of the photodiodes D1 and D2 is made higher than a defect density in the channel portion of the pixel TFT. Thus, while suppressing a leakage current of the pixel TFT, the sensitivity of the photodiodes D1 and D2 to light is improved. Moreover, a gate electrode is provided above an i region of a pin-type optical sensor diode with an insulating film interposed therebetween. Thus, a gate voltage can control a threshold of a bias voltage when a current starts to flow into the optical sensor diode and a leakage current is prevented from flowing into the optical sensor diode.

6 Claims, 24 Drawing Sheets

SUPPRESSION OF LEAKAGE CURRENT IN IMAGE ACQUISITION

CROSS-REFERENCE TO RELATED APPLICATIONS

This application is based upon and claims the benefit of priority from Japanese Patent Application No. 2002-254851 filed on Aug. 30, 2002 and No. 2002-281665 filed on Sep. 26, 2002; the entire contents of which are incorporated herein by reference.

BACKGROUND OF THE INVENTION

1. Field of the Invention

The present invention relates to a technology for suppressing a leakage current at the time of image acquisition in a display device including an image acquisition function or in an image acquisition circuit.

2. Description of the Related Art

A liquid crystal display device includes: a pixel array part including pixels at respective portions where a plurality of signal lines and a plurality of scan lines intersect with each other; and drive circuits which drive the signal lines and the scan lines. Along with the recent advanced development of integrated circuit technologies, a process technology for forming a part of the drive circuits on an array substrate together with the pixel array part has been put to practical use. Accordingly, the whole liquid crystal display device can be reduced in weight and size. Consequently, the liquid crystal display device is widely used as a display unit for various portable devices such as a portable telephone and a laptop computer.

Incidentally, herein proposed is a display device in which a contact-type area sensor performing image acquisition is disposed on an array substrate. For this technology, for example, Japanese Patent Laid-Open No. 2001-292276 and Japanese Patent Laid-Open No. 2001-339640 are disclosed.

Polysilicon has a larger mobility of electrons than that of amorphous silicon and therefore it is preferable to use polysilicon in order to form a part of the drive circuits on an array substrate.

However, even if active layers of various TFTs (thin film transistors) formed on the array substrate are formed of polysilicon, when a number of dangling bonds exist in the active layers, there is a problem of a leakage current flowing into the TFTs.

For solving such a problem, a technique of hydrogenating the active layers and terminating the dangling bonds is considered. However, in the case of the above-described contact-type area sensor, there is a problem in that, when the dangling bonds in the active layers are terminated, sensitivity to light is lowered.

Moreover, in an optical sensor diode used in a conventional image acquisition circuit, even if a reverse bias voltage is 0V, a weak leakage current is generated when light is irradiated, thus causing the accuracy of image acquisition deteriorate.

SUMMARY OF THE INVENTION

A display device of the first invention comprises switching elements for driving pixels that are formed at the respective intersections of signal lines and scan lines, and photoelectric conversion elements that are provided at least one by one while corresponding to the switching elements respectively and which convert light received within a specified range into an electric signal. The photoelectric conversion element has an I layer between a p layer and an n layer, and a defect density of this I layer is higher than a defect density of a channel portion of the switching element.

According to this invention, the defect density in the I layer of the photoelectric conversion element is made higher than the defect density in the channel portion of the switching element. Consequently, while suppressing the leakage current of the switching element, the sensitivity of the photoelectric conversion element to light can be improved.

The second invention is a method for manufacturing a display device of the first invention. The method comprises the steps of forming a polysilicon layer on an insulating substrate, forming a first insulating layer on the polysilicon layer, injecting impurity ions into regions where the switching elements and the photoelectric conversion elements are formed in the polysilicon layer respectively, forming a first metal layer on the first insulating layer, forming a first gate electrode for the photoelectric conversion element and a second gate electrode for the switching element by patterning the first metal layer, injecting impurity ions into regions where the switching elements and the photoelectric conversion elements are formed in the polysilicon layer respectively, hydrogenating the polysilicon layer so as to set a defect density in the region for forming the photoelectric conversion element to be higher than a defect density in the region for forming the switching element, and exposing regions where the respective electrodes of the switching element and the photoelectric conversion element are formed in the polysilicon layer, and forming a second metal layer in the exposed regions.

According to this invention, the hydrogenation of the polysilicon layer is performed so as to set a defect density in the region for forming the photoelectric conversion element to be higher than a defect density in the region for forming the switching element. Thus it can be made possible to manufacture the display device in which the leakage current of the switching element can be suppressed, and the sensitivity of the photoelectric conversion element to light can be improved.

An optical sensor diode of the third invention comprises a semiconductor layer including a p region to which p-type impurities are injected, an n region to which n-type impurities are injected and an i region with a lower impurity concentration than those of the p and n regions, an anode electrode connected to the p region, a cathode electrode connected to the n region, and a gate electrode provided above the i region with an insulating film interposed therebetween.

According to this invention, the gate electrode is provided above the i region of the pin-type optical sensor diode with an insulating film interposed therebetween, thus the threshold of the bias voltage when the current starts to flow into the optical sensor diode can be controlled by the gate voltage. Consequently, the leakage current can be prevented from flowing into the optical sensor diode to which no bias voltage higher than the gate voltage is applied even in the state where light is being irradiated.

An image acquisition circuit of the fourth invention comprises a plurality of signal lines installed on a glass insulating substrate, a plurality of selective lines installed so as to intersect with the signal lines, a common control line installed corresponding to each of the selective lines, selection switches provided for the respective signal lines, and gate-controlled type optical sensor diodes provided at the respective intersections of the signal lines and the selective lines, in which from an anode electrode and a cathode electrode, one is selected to be connected to the signal line, and the other one is connected to the selective line, and a gate electrode is connected to the common control line.

According to this invention, from an anode electrode and a cathode electrode of the gate-controlled type optical sensor diode, one is selected to be connected to the signal line of the image acquisition circuit, and the other one is connected to the selective line, and a gate electrode is connected to the common control line. Thus, a voltage applied to the gate electrode through the common control line can control the threshold of a bias voltage when a current starts to flow into the optical sensor diode.

The fifth invention is a method for driving an image acquisition circuit of the fourth invention. The method comprises the steps of applying a fixed voltage to the common control line, turning on a selection switch of a signal line to which an optical sensor diode for detecting the amount of light is connected, and applying a voltage larger than the fixed voltage to a selective line to which the optical sensor diode for detecting the amount of light is connected.

According to this invention, the threshold of the bias voltage when the current starts to flow is determined by applying a fixed voltage to the gate electrodes of all the optical sensor diodes through the common control line. The selective switch of the signal line connected to the optical sensor diode of which the light amount is to be detected is turned on, a bias voltage larger than the voltage applied to the gate electrode is applied to the selective line to which the optical sensor diode of which the light amount is to be detected is connected. Thus, only the current from the optical sensor diode flows into the signal line.

DESCRIPTION OF THE EMBODIMENTS

1. First Embodiment

Figure 1:
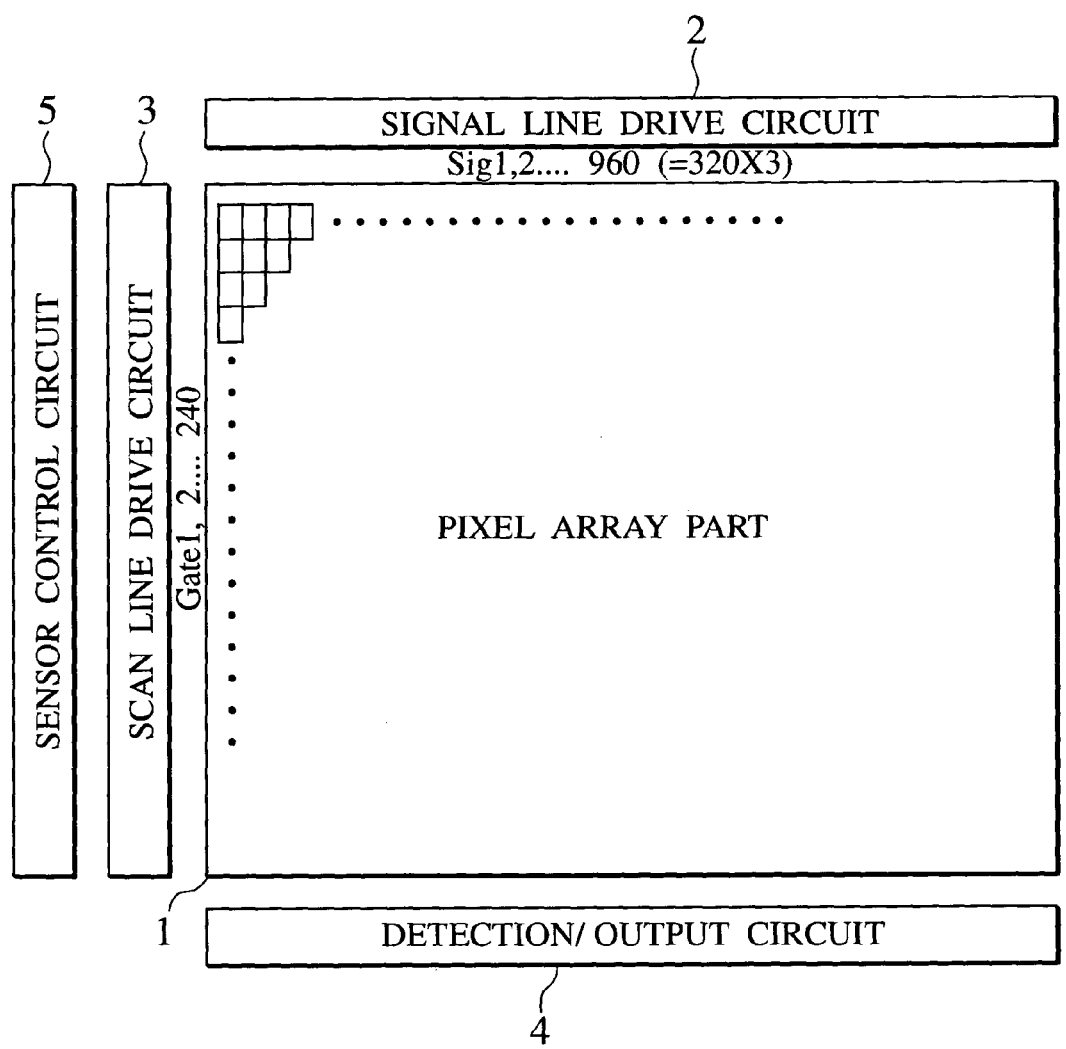
FIG. 1 is a circuit block diagram showing a schematic constitution of a display device according to a first embodiment.

As shown in a circuit block diagram of FIG. 1, a display device of a first embodiment includes, on an insulating substrate made of glass: a pixel array part 1 in which pixels are disposed at the respective intersections of signal lines and scan lines; a signal line drive circuit 2 which drives the signal lines; a scan line drive circuit 3 which drives the scan lines; a detection/output circuit 4 which acquires and outputs an image; and a sensor control circuit 5 which controls sensors for image acquisition. This detection/output circuit 4 includes analog/digital conversion circuits for image acquisition and parallel/serial conversion circuits for output. These above-described circuits constitute an array substrate.

Figure 2:
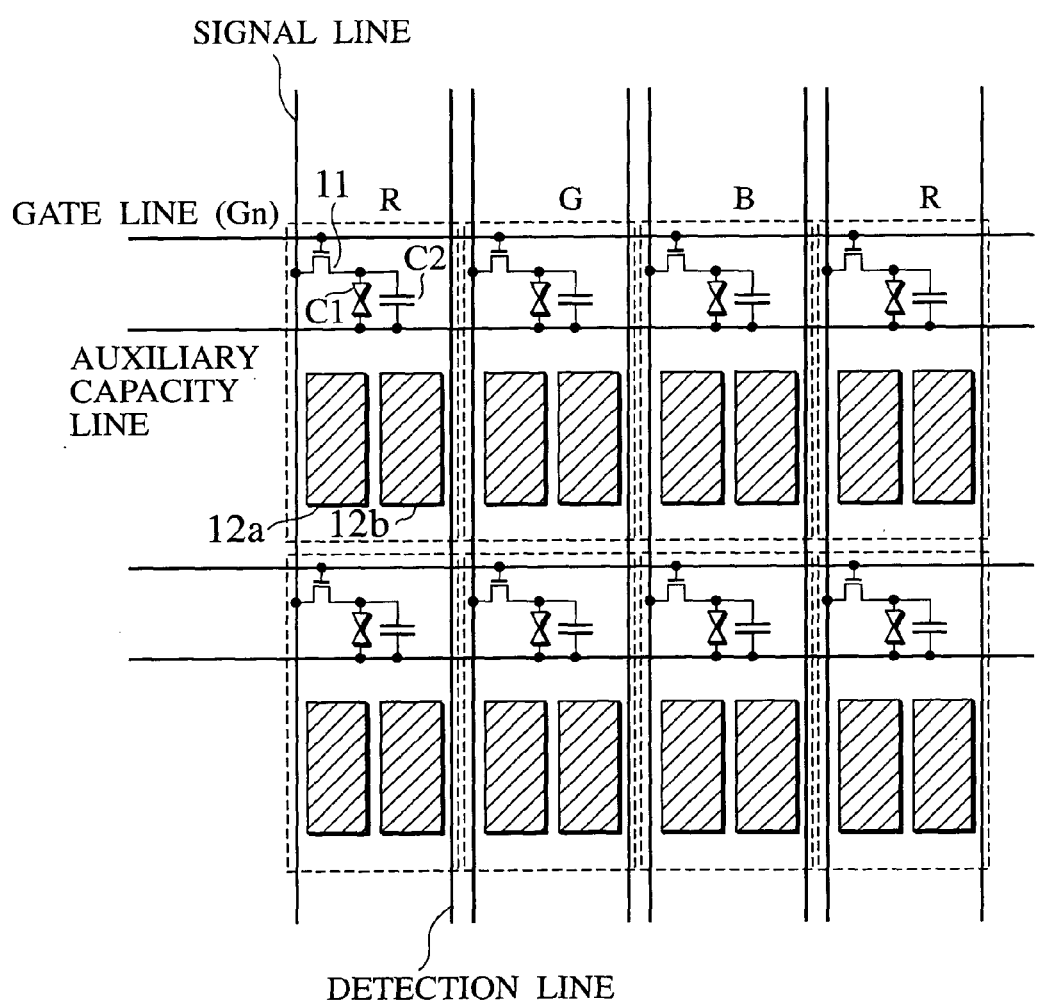
FIG. 2 is a circuit block diagram showing a part of a pixel array part shown in FIG. 1 in detail.

As shown in a detailed circuit block diagram of FIG. 2, the pixel array part 1 has: switching elements 11 for driving pixels, which are formed at the respective intersections of the signal lines and the scan lines (gate lines) that are installed vertically and horizontally; liquid crystal capacities C1 and auxiliary capacities C2 which are connected between one end of the respective switching elements 11 and auxiliary capacity lines; and the image acquisition sensors 12a and 12b, both of which are provided for every switching element 11. The sensors 12a and 12b are connected to unillustrated power lines and control lines. The respective pixels are disposed in order while corresponding to red (R), green (C) and blue (B). Here, as an example, the switching element 11 is assumed to be formed of a thin film transistor and, hereinafter, called a pixel TFT.

Figure 3:
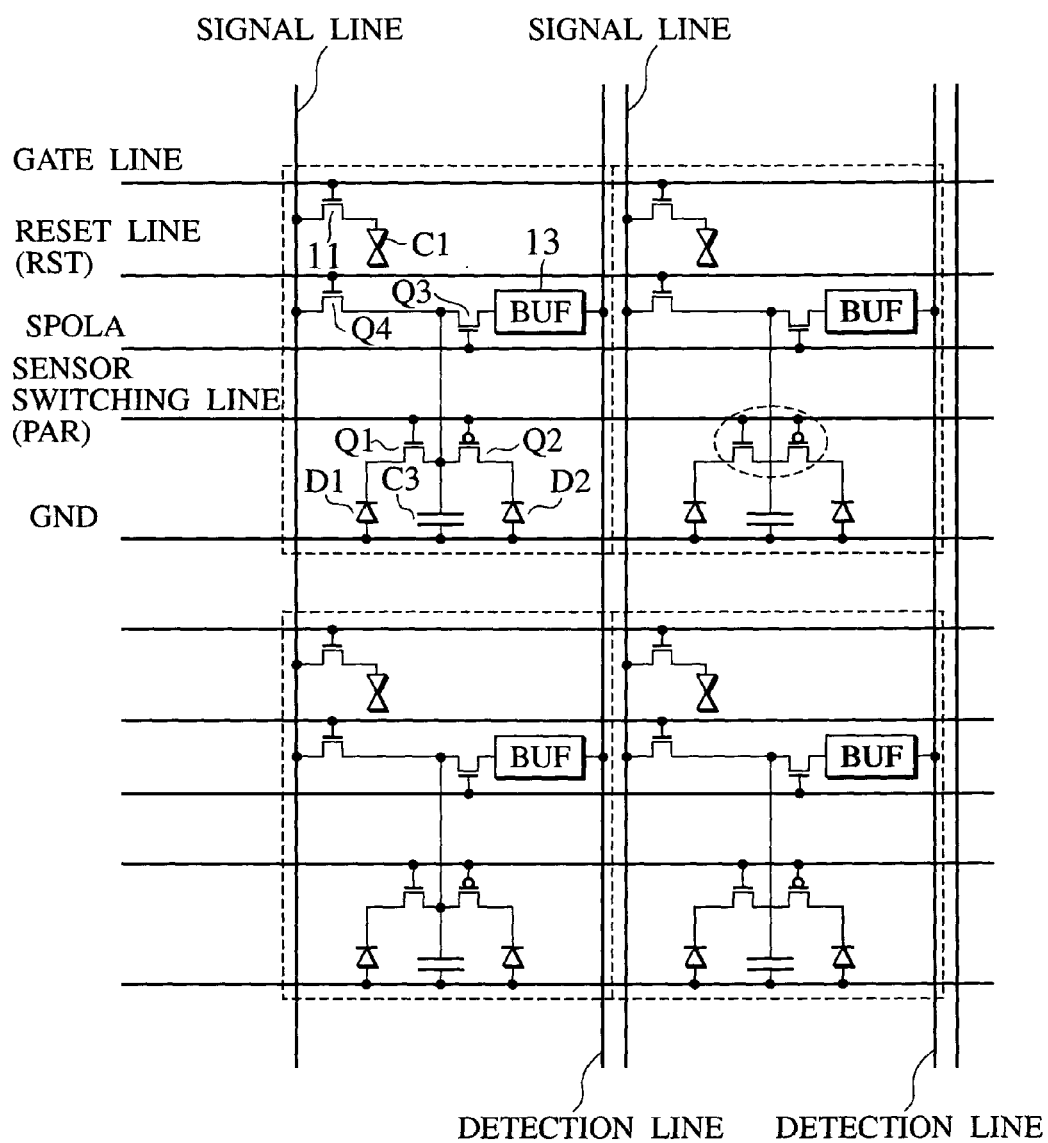
FIG. 3 is a circuit diagram showing a part of FIG. 2 in detail.

As shown in a circuit diagram of FIG. 3, the sensors 12a, 12b have photodiodes D1, D2 as photoelectric conversion elements and sensor switching transistors Q1, Q2, respectively. The photodiodes D1 and D2 output electric signals, respectively, which correspond to an amount of light received thereby. The sensor switching transistors Q1 and Q2 are connected to a sensor switching line, and alternately select one of the photodiodes D1 and D2 within one pixel in accordance with a signal PAR supplied via the sensor switching line.

Each pixel has: the two sensors 12a and 12b; a capacitor C3 shared by the two sensors 12a and 12b within the same pixel; a buffer 13 which stores binary data corresponding to charges accumulated in the capacitor C3; a transistor Q3 which performs write control f or the buffer 13; and a reset transistor Q4 which initializes the buffer 13 and the capacitor C3. On/off of the transistor Q3 is controlled by a signal SPOLA. A gate of the transistor Q4 is connected to a reset line and on/off of the transistor Q4 is controlled by a signal RST.

Figure 4:
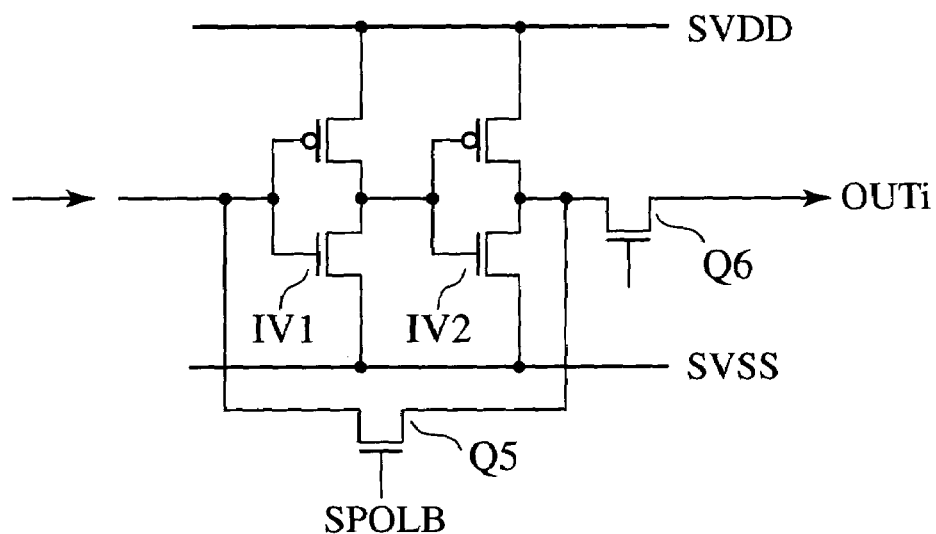
FIG. 4 is a circuit diagram showing an internal constitution of a buffer shown in FIG. 3.

The buffer 13 includes a static RAM (SRAM). As shown in a circuit diagram of FIG. 4, the buffer 13, for example, has a constitution having: two series-connected inverters IV1 and IV2; a transistor Q5 connected between an output terminal of the latter inverter IV2 and an input terminal of the former inverter IV1; and an output transistor Q6 connected to the output terminal of the latter inverter IV2.

When a signal SPOLB is at its high level, the transistor Q5 is turned on and the two inverters IV1 and IV2 perform a retention operation. An output terminal of the transistor Q6 is connected to a detection line and when the transistor Q6 is on, data retained by the inverters IV1 and IV2 is outputted to the detection line as a signal OUTi.

The display device of this embodiment can perform a normal display operation as well as image acquisition similar to that performed by a scanner. In the case of performing the normal display operation, the transistor Q3 is set in its off state and no effective data is stored in the buffer 13. A signal line voltage corresponding to video data is supplied to the signal line from the signal line drive circuit 2. This signal line voltage is applied to liquid crystal through the pixel TFT 11 and thus the normal display operation is performed.

Figure 5:
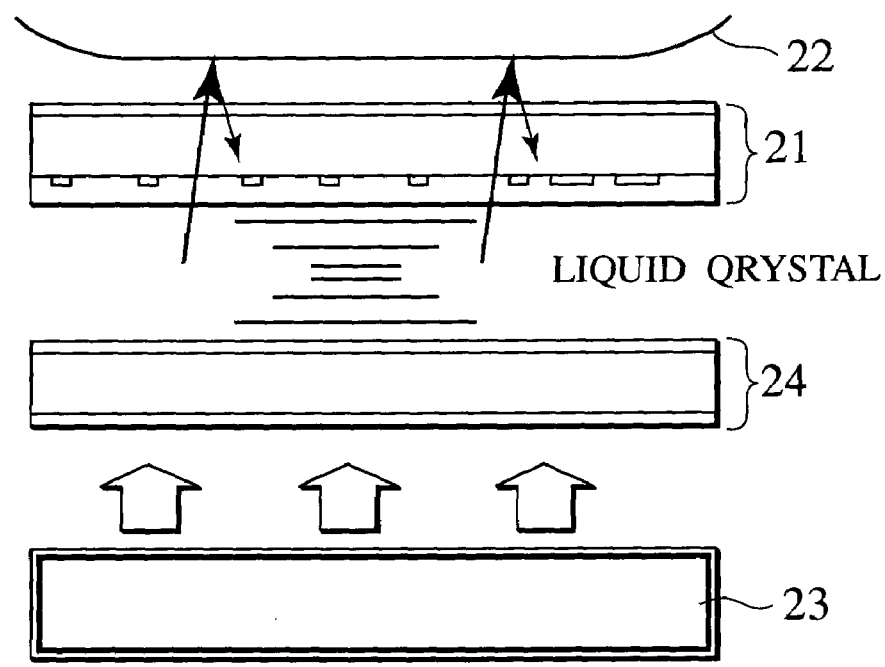
FIG. 5 is a simplified cross-sectional view showing a structure of the display device of FIG. 1.

Meanwhile, in the case of performing the image acquisition, as shown in a cross-sectional view of FIG. 5, an image acquisition object 22, for example, a piece of paper is disposed on an upper surface side of an array substrate 21 and light from a backlight 23 is irradiated onto the paper 22 through an opposing substrate 24, liquid crystal and the array substrate 21. The light reflected on the paper 22 is received by the sensors 12a and 12b in the array substrate 21 and image acquisition is performed. The acquired image data is temporarily stored in the buffer 13 and, thereafter, is sent to an unillustrated CPU via the detection line. This CPU receives a digital signal outputted from the display device of this embodiment and performs operation processing such as rearrangement of data and removal of noise in data. Note that the CPU may include one semiconductor chip or a plurality of semiconductor chips.

Figure 6:
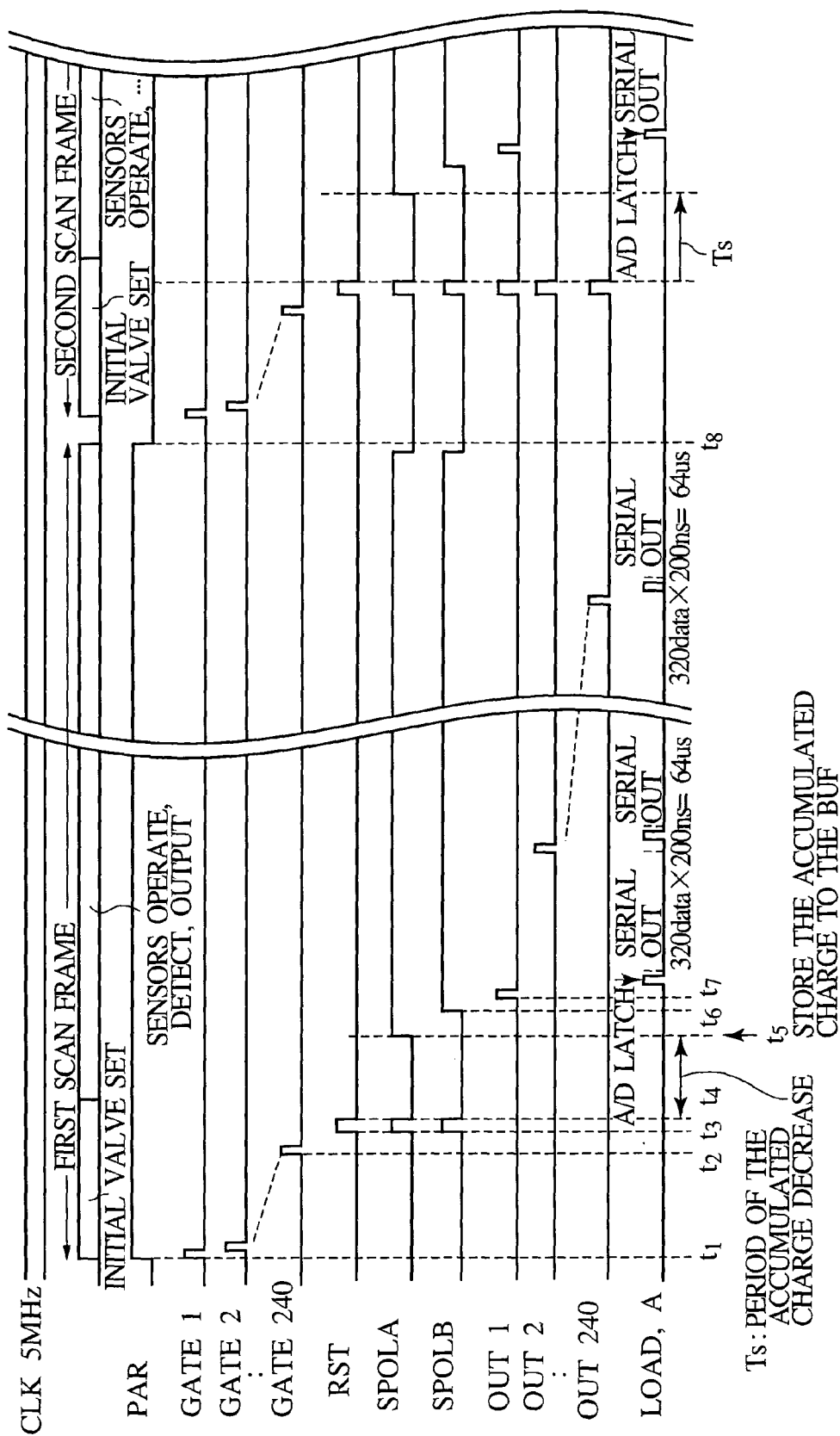
FIG. 6 is a timing chart showing an operation during image acquisition in the display device of the first embodiment.

Next, an operation in the image acquisition will be described by use of the timing chart of FIG. 6. Here, it is assumed, as an example, that the pixel array part 1 includes pixels of 320×240 dots and there are 240 gate lines.

First, at the time t1, the signal PAR reaches the high level, the transistor Q1 is turned on and the sensor 12a is selected.

At the times t1 to t2, the gate lines of the pixel array part 1 are sequentially driven one by one and all the pixels are set in the same color, for example, white.

At the time t3, the signals RST, SPOLA and SPOLB are all set so to be at the high level and all the transistors Q3, Q4 and Q5 are turned on. Accordingly, initial values are set in the buffer 13 and the capacitor C3.

At the time t4, the signal RST reaches the low level and the sensors 12a and 12b start image acquisition. When light reflected from the paper 22 is received by the photodiodes D1 and D2 in the sensors 12a and 12b, charges accumulated in the capacitor C3 flow to a grounding terminal GND through the photodiodes D1 and D2. Specifically, a light leakage current flows. Thus, the accumulated charges of the capacitor C3 are decreased.

At the time of t5, the signal SPOLA reaches the high level, the transistor Q3 is turned on and binary data corresponding to the accumulated charges of the capacitor C3 at this point is stored in the buffer 13.

At the time of t6, the signal SPOLB reaches the high level, the transistor Q5 is turned on and the buffer 13 starts a retention operation. Thereafter, at the time of t7, the data stored in the buffer 13 is sequentially supplied to the detection line for each of the pixels and sent to the unillustrated CPU.

The reason for providing the buffer 13 for each of the pixels in FIG. 3 is as follows: The accumulated charges of the capacitor C3 leak due to currents flowing through the photodiodes D1 and D2 in the sensors 12a and 12b and also due to currents flowing through the respective transistors in the pixel. Thus, with the lapse of time, the accumulated charges of the capacitor C3 are decreased and voltages at both ends of the capacitor C3 are also lowered. Consequently, the buffer 13 is provided for each of the pixels and the accumulated charges of the capacitor C3 are transferred to the buffer 13 before leakage thereof occurs. Thus, image acquisition that is not affected by the leakage is made possible. As described above, the reason why the SRAM is used as the buffer 13 is that, even if the light of several hundred thousand lux is irradiated, the SRAM is at no risk of causing an error such as logical inversion.

After the time t8, the sensor-switching signal PAR reaches the low level and the display device of this embodiment performs the image acquisition by switching the sensors 12a and 12b.

The pixel array part 1 and the respective transistors including the pixel TFT 11 used for each of the circuits 2 to 5, all of which are on the array substrate 21 of this embodiment, are n channel TFTs or p channel TFTs. The n channel and p channel TFTs (hereinafter collectively called TFTs) are formed in a common manufacturing process.

By using FIGS. 7A to 7E and 8A to 8E, the manufacturing process of the n channel and p channel TFTs will be described below.

First, on a glass insulating substrate 31, an undercoat layer made of SiNx, SiOx or the like is formed by CVD. The reason for forming the undercoat layer is because impurities are prevented thereby from diffusing into elements formed on the insulating substrate 31.

Next, after an amorphous silicon film is formed on the insulating substrate 31 by PECVD, sputtering or the like, the amorphous silicon film is crystallized by laser irradiation and a polysilicon film 32 is formed.

Figure 7A:
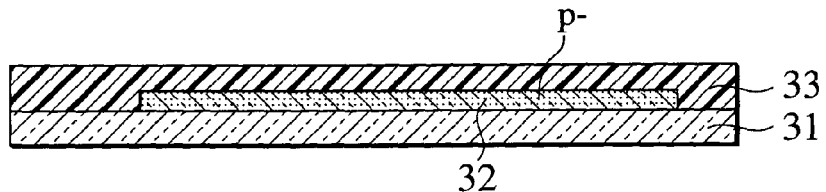
FIGS. 7A to 7E are process diagrams in manufacturing an n channel TFT.
Figure 8A:
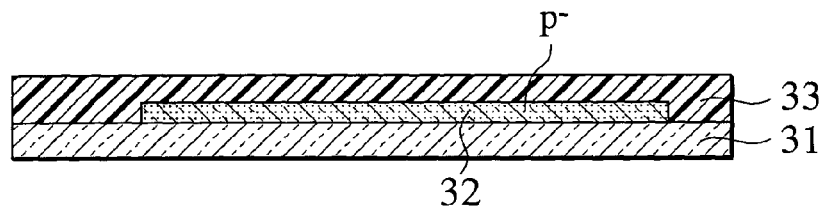
FIGS. 8A to 8E are process diagrams in manufacturing a p channel TFT.

Next, the polysilicon film 32 is subjected to patterning and a first insulating layer 33 made of a SiOx film is formed by PECVD, ECR-CVD or the like. Thereafter, boron ions in a low concentration are injected as impurities into a region where the n channel and p channel TFTs are formed in the polysilicon film 32 and thus a p-layer is formed (FIG. 7A and FIG. 8A).

Figure 7B:
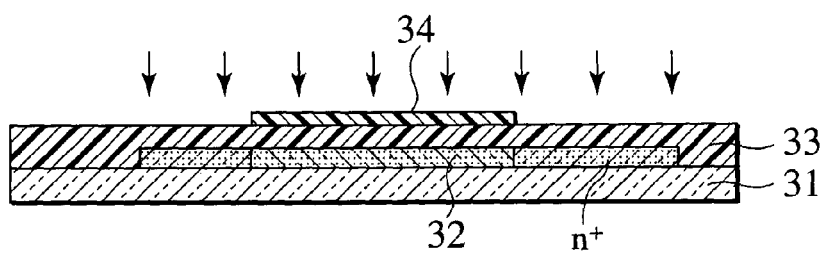
Figure 8B:
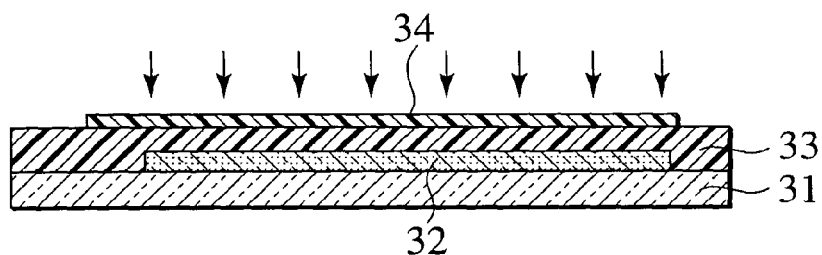

Next, by use of a resist 34 as a mask, phosphorous ions are injected into a region where the n channel TFT is formed and an $n^+$ layer is formed in a part of the polysilicon film 32 (FIG. 7B). The resist 34 prevents the phosphorous ions from being injected into a region where the p channel TFT is formed (FIG. 8B).

Figure 7C:
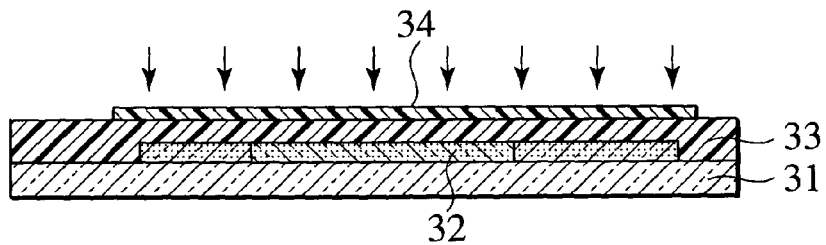
Figure 8C:
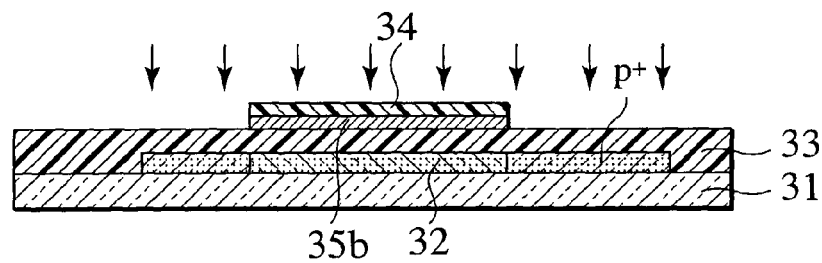

Next, a first metal layer is formed on the first insulating layer 33 by use of Mo—Ta, Mo—W or the like and patterning of the first metal layer forms a second gate electrode 35b. Thereafter, by use of the resist 34 as a mask, boron ions are injected as impurities into the region where the p channel TFT is formed (FIG. 8C). The resist 34 prevents the boron ions from being injected into the region where the n channel TFT is formed (FIG. 7C).

Figure 7D:
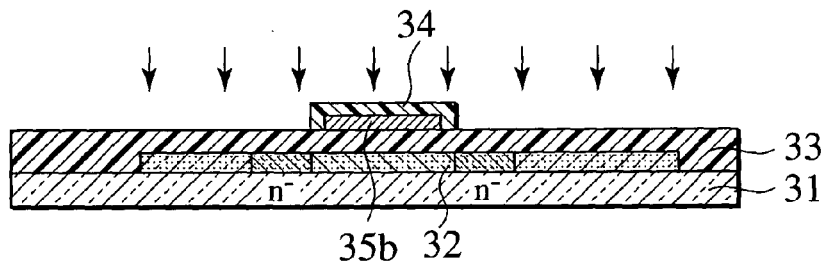
Figure 8D:
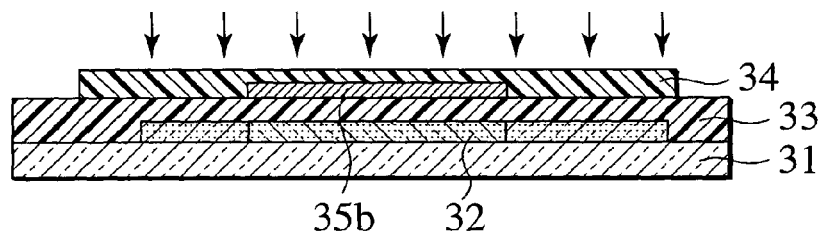

Next, by use of the resist 34 as a mask, phosphorous ions with a low concentration are injected into the region where the n channel TFT is formed (FIG. 7D). The polysilicon film located directly below the spot masked by the resist 34 remains as the p-layer. The resist 34 prevents the phosphorous ions from being injected into the region where the p channel TFT is formed (FIG. 8D). Note that, instead of using the resist 34, the first metal layer patterned so as to have a predetermined shape may be used. Both the resist 34 and the first metal layer have the same effect of blocking the ion injection. In consideration of the various conditions of the manufacturing process, one that is more advantageous than others may be used.

Next, so-called hydrogenation is performed. The hydrogenation is a process of exposing the substrate in plasma of hydrogen. This process is performed by use of a CVD apparatus. The hydrogenation enables the termination of dangling bonds in the region where the TFT channel is formed in the polysilicon film 32. This hydrogenation is performed for the purpose of suppressing a leakage current of the TFT. When the substrate is exposed to the plasma of hydrogen, the hydrogen is blocked by the gate electrode 35b and goes around from a portion where no gate electrode 35b exists to enter the polysilicon film 32. This hydrogenation will be described later in detail.

Figure 7E:
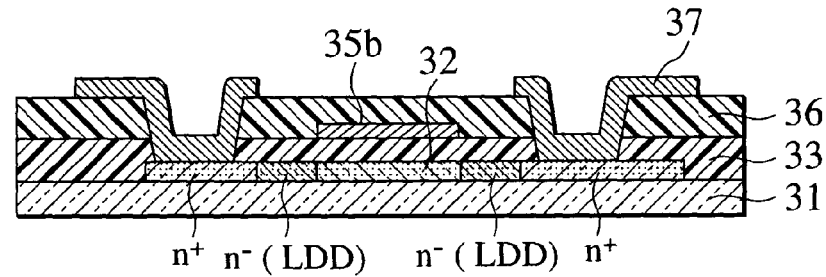
Figure 8E:
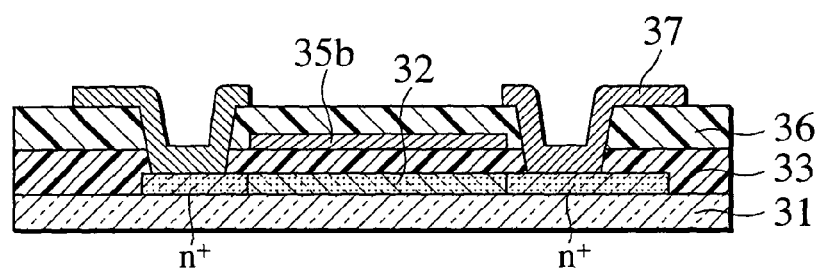

Subsequently to the hydrogenation, a second insulating layer 36 made of SiOx is formed on the first insulating layer 33 in the same CVD apparatus. Next, providing a contact hole exposes a region of the n channel and p channel TFTs and a second metal layer 37 is formed in this exposed region. The second metal layer 37 is patterned and thus source and drain electrodes are formed (FIG. 7E and FIG. 8E). Lastly, a SiN film is formed as a passivation film, thus the n channel and p channel TFTs are completed.

Subsequently, by use of FIGS. 9A to 9E, description will be given of a manufacturing process for the photodiodes D1 and D2, which have a PIN structure. Basically, the photodiodes D1 and D2 preferably have the PIN structure including a $p^+$ layer, a $p^-$ layer, an $n^-$ layer and an $n^+$ layer. This is because the PIN structure has a wide depletion layer and a good conversion efficiency of light to current. Here, an I layer is equivalent to a layer including the $p^-$ layer and the $n^-$ layer which are formed between the $p^+$ layer and the $n^+$ layer. The $n^-$ layer is effective for suppressing a thermal leakage current. The more the thermal leakage current is suppressed, the higher an on/off ratio of a photocurrent becomes.

Figure 9A:
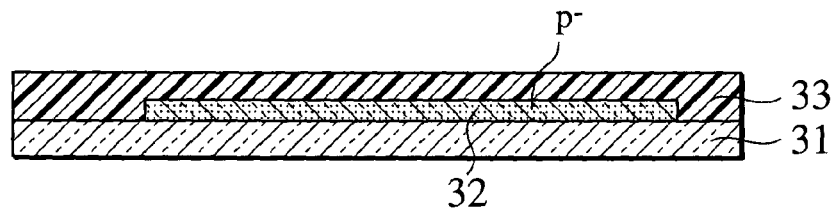
FIGS. 9A to 9E are process diagrams in manufacturing a photodiode.

In the manufacturing process of the photodiodes D1 and D2, an amorphous silicon film is first formed on the insulating substrate 31 by PECVD, sputtering or the like and, thereafter, the amorphous silicon film is crystallized by laser irradiation and thus a polysilicon film 32 is formed. Next, the polysilicon film 32 is patterned and a first insulating layer 33 made of a SiOx film is formed by PECVD, ECR-CVD or the like. Thereafter, boron ions with a low concentration are injected as impurities into a region where the photodiodes D1 and D2 are formed in the polysilicon film 32 and thus the $p^-$ layer is formed (FIG. 9A).

Figure 9B:
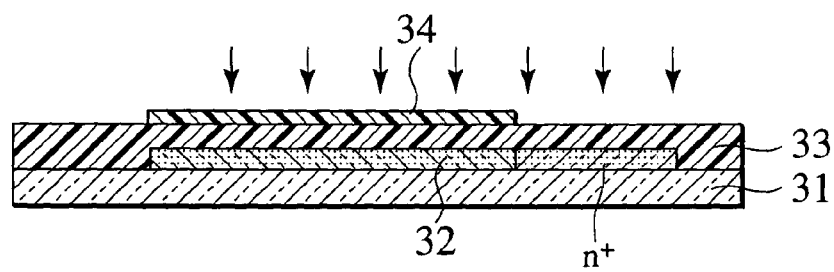

Next, by use of a resist 34 as a mask, phosphorous ions are injected into a part of the polysilicon film 32 and thus the $n^+$ layer is formed (FIG. 9B).

Next, a first metal layer is formed on the first insulating layer 33 and patterning the first metal layer forms a first gate electrode 35a. Thereafter, by use of the resist 34 as a mask, boron ions are injected as impurities into the region where the photodiodes D1 and D2 are formed and thus the $p^+$ layer is formed in a part of the polysilicon film 32 (FIG. 9C).

Figure 9C:
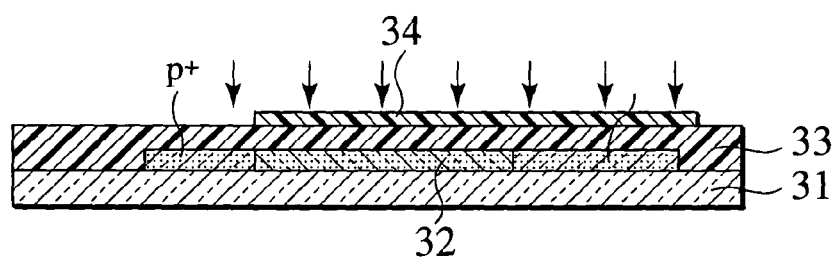
Figure 9D:
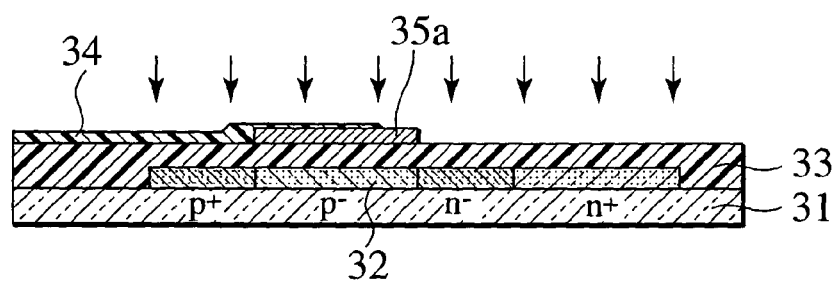

Next, by use of the resist 34 as a mask, phosphorous ions with a low concentration are injected into the polysilicon film 32 (FIG. 9D). The polysilicon film located directly below the spot masked by the resist 34 remains as the $p^-$ layer. Note that, instead of using the resist 34, the first metal layer patterned to have a predetermined shape may be used. Both the resist 34 and the first metal layer have the same effect of blocking the ion injection. In consideration of the various conditions of the manufacturing process, one that is more advantageous than others may be used. Subsequently, hydrogenation of the I layer is performed. This hydrogenation will be described later in detail.

Next, a second insulating layer 36 is formed on the first insulating layer 33. Thereafter, providing a contact hole exposes a region where electrodes of the photodiodes are formed, a second metal layer 37 is formed in this exposed region and this second metal layer is patterned so as to have a predetermined shape (FIG. 9E).

Figure 9E:
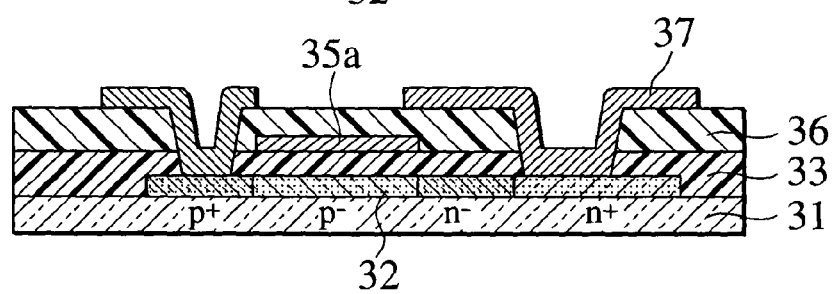

The photodiode shown in FIGS. 9A to 9E can be manufactured in the same process as that of the TFT shown in FIGS. 7A to 7E and 8A to 8E. Specifically, FIGS. 7A, 8A and 9A are performed in the same process. Similarly, FIGS. 7B, 8B and 9B are performed in the same process, FIGS. 7C, 8C and 9C are performed in the same process, FIGS. 7D, 8D and 9D are performed in the same process and FIGS. 7E, 8E and 9E are performed in the same process. In such a manner, by sharing the manufacturing process, a reduction in manufacturing costs can be achieved.

As described above, in this embodiment, in either case, when forming the TFT or the photodiode, the hydrogenation is performed. However, in the case of forming the photodiode, progress of the hydrogenation is curbed when compared to the case of forming the TFT. The reason for the above is as follows: Specifically, in the case of the TFT, the dangling bond in the polysilicon film 32 is preferably terminated by the hydrogenation because the leakage current is reduced in this way. On the contrary, in the case of the photodiode, a trap level is increased if the dangling bond in the polysilicon film 32 is not terminated and thus, the efficiency of photoelectric conversion is improved. This is because of the following reason: Specifically, when light with an energy larger than a given energy gap Eg is made incident, the electrons and holes are generated, and the light leakage current occurs. Therefore, when a number of dangling bonds exist in the photodiode, the trap level is increased and thus the photoelectric conversion is made possible even for light with an energy smaller than the given energy gap.

Figure 10:
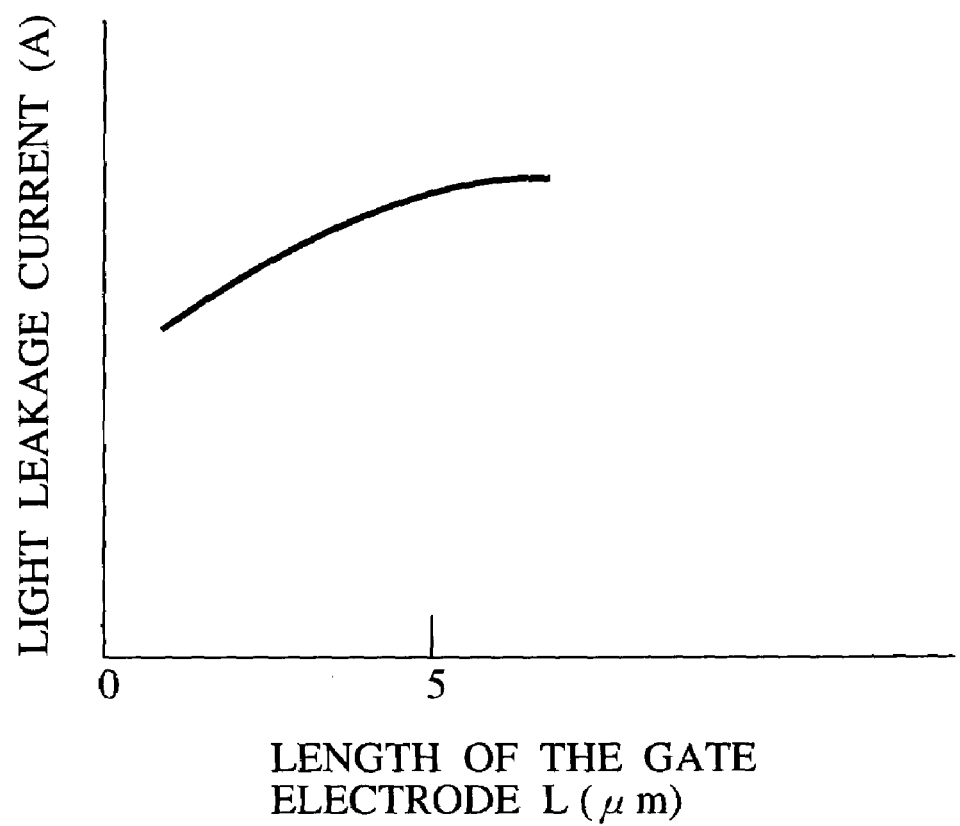
FIG. 10 is a graph showing a relationship between a gate length and a leakage current.
Figure 11A:
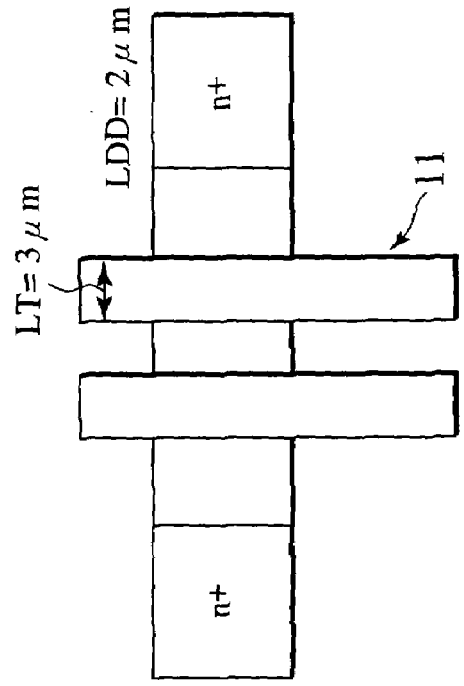
FIG. 11A is a plan view showing a constitution of a photodiode and FIG. 11B is a cross-sectional view of FIG. 11A.
Figure 12A:
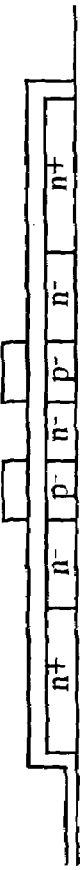
FIG. 12A is a plan view showing a constitution of a TFT and FIG. 12B is a cross-sectional view of FIG. 12A.

The inventors of the present application have confirmed by conducting experiments that the longer the length of the gate electrode becomes, the more the light leakage current is increased as shown in FIG. 10. Therefore, in this embodiment, the length LT of the second gate electrode (hereinafter called the gate length of the TFT), which is disposed on the channel of the TFT shown in FIGS. 12A and 12B, is made shorter than the length Lp of the first gate electrode (hereinafter called the gate length of the photodiode), which is made of MoW and disposed on the I layer of the photodiodes D1 and D2 shown in FIGS. 11A and 11B. Note that FIG. 11B shows a state where the first gate electrode is formed on the p⁻ layer of the photodiodes D1 and D2, and FIG. 12B shows a state where the second gate electrode is formed on the p⁻ layer of the TFT.

Figure 13A:
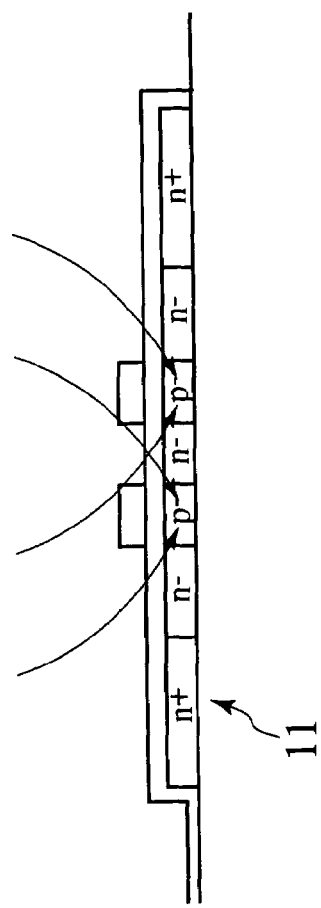
FIG. 13A is a cross-sectional view showing a state of hydrogenating a photodiode and FIG. 13B is a cross-sectional view showing a state of hydrogenating a TFT.
Figure 13B:
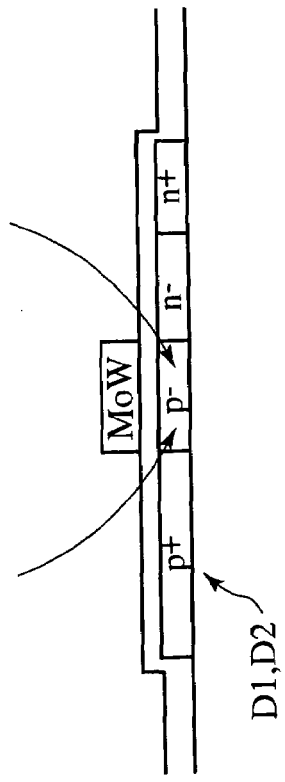

The reason why the light leakage current can be variably controlled by the gate length is as follows. As shown in a cross-sectional view of the photodiodes D1 and D2 in FIG. 13A and a cross-sectional view of the TFT in FIG. 13B, the hydrogenation occurs so as to go around the gate electrode from end portions of the gate electrode. Therefore, the longer the gate length is, the less likely the hydrogenation is to occur in the vicinity of the spot directly below the gate electrode. Accordingly, the gate length of the photodiodes D1 and D2 is made longer than the gate length of the TFT so as to prevent the progress of the hydrogenation for the photodiodes D1 and D2 compared to that for the TFT. Thus, a proportion of the dangling bonds that are terminated in the photodiodes is made smaller than that of the TFT. Consequently, a defect density due to the dangling bonds not terminated in the I layer of the photodiodes D1 and D2 is made higher than a defect density in the channel portion of the TFT.

Figure 11B:
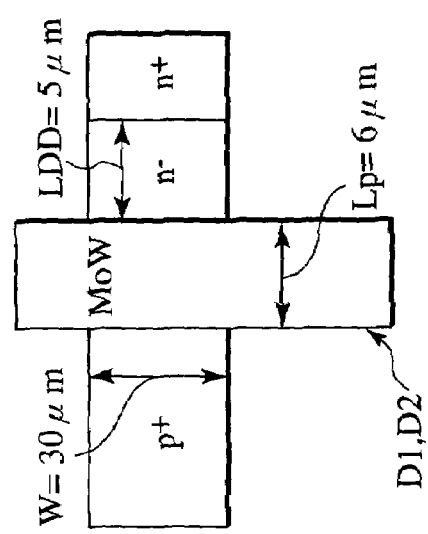
Figure 12B:
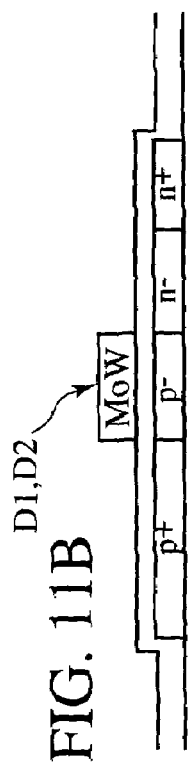

For example, the gate length of the first gate electrode disposed on the p⁻ layer of the photodiode shown in FIG. 11B is made longer than the gate length of the second gate electrode disposed on the channel portion of the TFT shown in FIG. 12B. Thus, the defect density in the p⁻ layer of the photodiodes D1 and D2 is made higher than the defect density in the channel portion of the TFT.

Moreover, control of the time of the hydrogenation also makes a difference in the progress of the hydrogenation. Specifically, the shorter the hydrogenation time, the smaller the proportion of the dangling bonds to be terminated. Accordingly, the time taken for hydrogenating the I layer of the photodiodes D1 and D2 is made shorter than the time taken for hydrogenating the channel portion of the TFT. Thus, the proportion of the dangling bonds terminated in the photodiode is made smaller than that of the TFT. Consequently, the defect density in the I layer of the photodiodes D1 and D2 is made higher than the defect density in the channel portion of the TFT 11.

As described above, in this embodiment, in the manufacturing process of the display device, the hydrogenation in the I layer of the photodiodes D1 and D2 is prevented from progressing compared to the hydrogenation in the channel portion of the pixel TFT 11. Accordingly, the proportion of the dangling bonds terminated in the photodiodes D1 and D2 is made smaller than that of the TFT, thus the defect density in the I layer of the photodiodes D1 and D2 is made higher than the defect density in the channel portion of the pixel TFT 11. Consequently, while suppressing the leakage current of the pixel TFT 11, the sensitivity of the photodiodes D1 and D2 to light can be improved.

Moreover, it is known that, even when no light is irradiated, the thermal leakage current occurs. The thermal leakage current is suppressed by an LDD layer (the n⁻ layer portion in FIG. 9E). In addition, the longer the gate length becomes, the more the thermal leakage current is suppressed. Accordingly, in the TFT, in order to suppress both the light leakage current and the thermal leakage current, a plurality of gate electrodes with a short gate length are provided and thus a so-called double-gate structure or triple-gate structure is adopted. Consequently, it is preferable to suppress the light leakage current by facilitating the progress of the hydrogenation with the short gate length and suppress the thermal leakage current by. lengthening the total gate length.

From the above reasons, in this embodiment, the gate length Lp of the single gate electrode is 6 μm in the photodiodes D1 and D2 (FIG. 11A) and the TFT such as the pixel TFT 11 and the transistors Q1 to Q4 has the double-gate structure using two gate electrodes with the gate length LT of 3 μm (FIG. 12A).

Note that, in this embodiment, an example of constituting the photoelectric conversion elements by use of the photodiodes D1 and D2 was described. However, those elements may be constituted by use of the TFT. In this case, the gate length of the TFT which is to be the photoelectric conversion element is made longer than that of the other TFT and thus an effect similar to that of this embodiment can be obtained.

2. Second Embodiment

Figure 14:
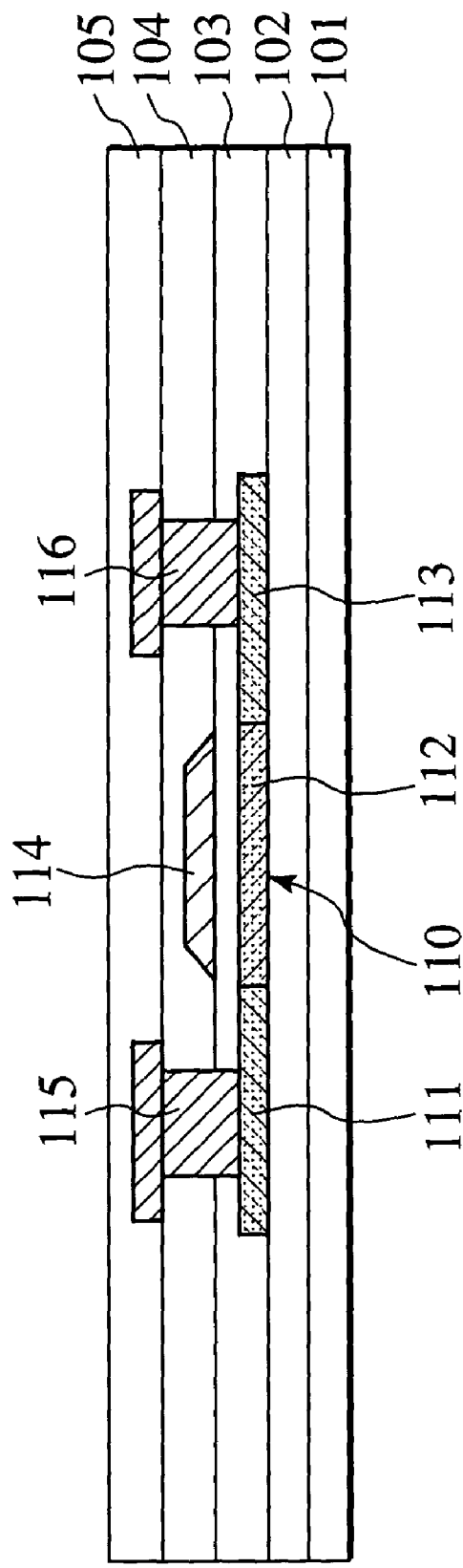
FIG. 14 is a cross-sectional view showing a constitution of an optical sensor diode according to a second embodiment.

As shown in a cross-sectional view of FIG. 14, in an optical sensor diode according to a second embodiment, a silicon film 102 is formed to have a thickness of about 150 nm on a glass insulating substrate 101 by plasma CVD. The silicon film 102 is formed of silicon nitride, silicon oxide or lamination thereof. On the silicon film 102, a semiconductor layer 110 made of polysilicon is formed so as to have a thickness of about 50 nm. This semiconductor layer 110 is formed by disposing a p region 111 with p-type impurities injected therein, an i region 112 including hardly any impurities and a n region 113 with n-type impurities injected therein adjacently to each other in this order. In the p region 111, boron is injected, for example, at a high concentration of about $1 \times 10^{19}$ atm/cm³. In the n region 113, phosphorous is injected at a high concentration of about $1 \times 10^{19}$ atm/cm³. The i region 112 may be a region to which boron or phosphorous is injected at a lower concentration, such as $1 \times 10^{15}$ atm/cm³ than the p region 111 and the n region 113, in order to prevent characteristic fluctuations caused by unexpected impurities.

On the silicon film 102 having the semiconductor layer 110 formed thereon, a silicon oxide film 103 is formed, as an insulating film, so as to have a thickness of about 50 to 100 nm. On the silicon oxide film 103, a gate electrode 114 is formed with a thickness of about 300 nm, which is made of molybdenum tungsten alloy, so as to cover at least the i region 112. In this state, on the silicon oxide film 103, a silicon oxide film 104 is further formed. On the silicon oxide film 104, an anode electrode 115 and a cathode electrode 116, which are made of molybdenum and an aluminum lamination film, are formed at positions corresponding to the p region 111 and the n region 113, respectively. Specifically, respective tips of the electrodes are about 600 nm thick. Respective main body portions of the anode and cathode electrodes 115 and 116 are formed so as to contact with the p region 111 and the n region 113, respectively, via contact holes pierced in the silicon oxide films 103 and 104. In this state, on the silicon oxide film 104, a silicon nitride film 105 is further formed.

As described above, the optical sensor diode of this embodiment has a constitution in which the gate electrode 114 is provided above the i region 112 of the pin-type thin film diode for optical sensor with the insulating film interposed therebetween.

Figure 15:
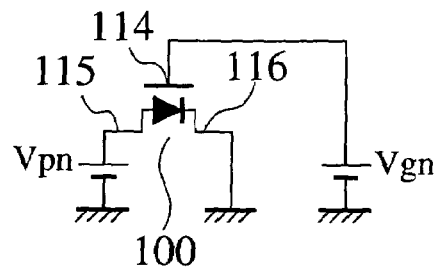
FIG. 15 is a circuit diagram showing a circuit configuration using the optical sensor diode of FIG. 14.

As shown in the circuit diagram of FIG. 15, in an example of a circuit using the optical sensor diode of this embodiment, a bias voltage Vpn is supplied to the anode electrode 115 of the optical sensor diode 100 and a gate voltage Vgn is supplied to the gate electrode 114. The cathode electrode 116 is connected to the ground.

Figure 16:
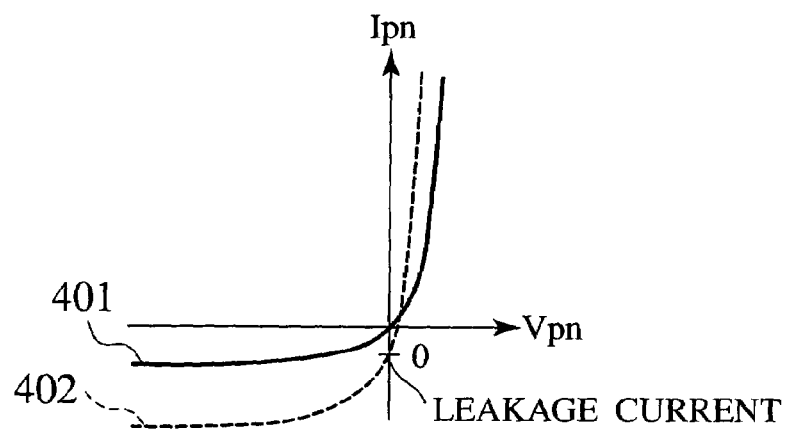
FIG. 16 is a graph showing current-voltage characteristics of the optical sensor diode when a gate voltage Vgn is set at 0V in the circuit diagram shown in FIG. 15.

The graph of FIG. 16 shows current-voltage characteristics when the gate voltage Vgn is set to 0V in the circuit diagram shown in FIG. 15. Specifically, this graph corresponds to current-voltage characteristics of a conventional optical sensor diode with no gate electrode. This graph shows a characteristic 401 in the case of irradiating no light and a characteristic 402 in the case of irradiating light. In the case of irradiating light, a leakage current occurs at Vpn=0V at which a reverse bias current starts to flow into the optical sensor diode 100.

Figure 17:
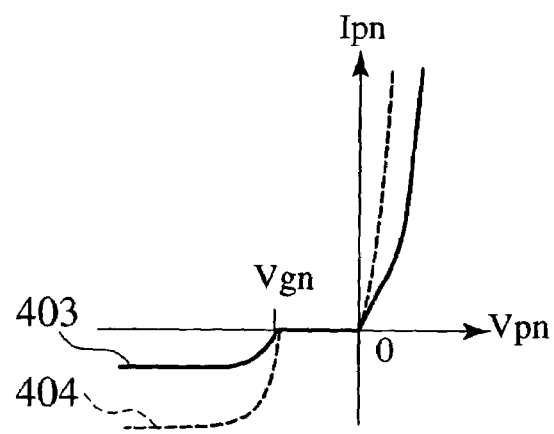
FIG. 17 is a graph showing current-voltage characteristics of the optical sensor diode when a fixed voltage is applied as the gate voltage Vgn in the circuit diagram shown in FIG. 15.

The graph of FIG. 17 shows current-voltage characteristics of the optical sensor diode 100 when a fixed reverse bias voltage is applied as the gate voltage Vgn in the circuit diagram shown in FIG. 15. This graph shows a characteristic 403 in the case of irradiating no light and a characteristic 404 in the case of irradiating light. Within the range of Vgn<Vpn<0, a distinctive characteristic wherein absolutely no current flows is obtained. This characteristic shows that no current starts to flow until the reverse bias voltage between the anode and cathode terminals 115 and 116 becomes higher than the reverse bias voltage applied to the gate electrode 114. Specifically, the characteristic indicates that the gate voltage Vgn can control a threshold of the bias voltage when a current starts to flow into the optical sensor diode.

As described above, according to this embodiment, the gate electrode 114 is provided above the i region 112 of the pin-type optical sensor diode with the insulating film interposed therebetween, thus the threshold of the bias voltage when the current starts to flow into the optical sensor diode can be controlled by the gate voltage. Consequently, the leakage current can be prevented from flowing into the optical sensor diode to which no bias voltage higher than the gate voltage is applied even in the state where light is being irradiated.

Figure 18:
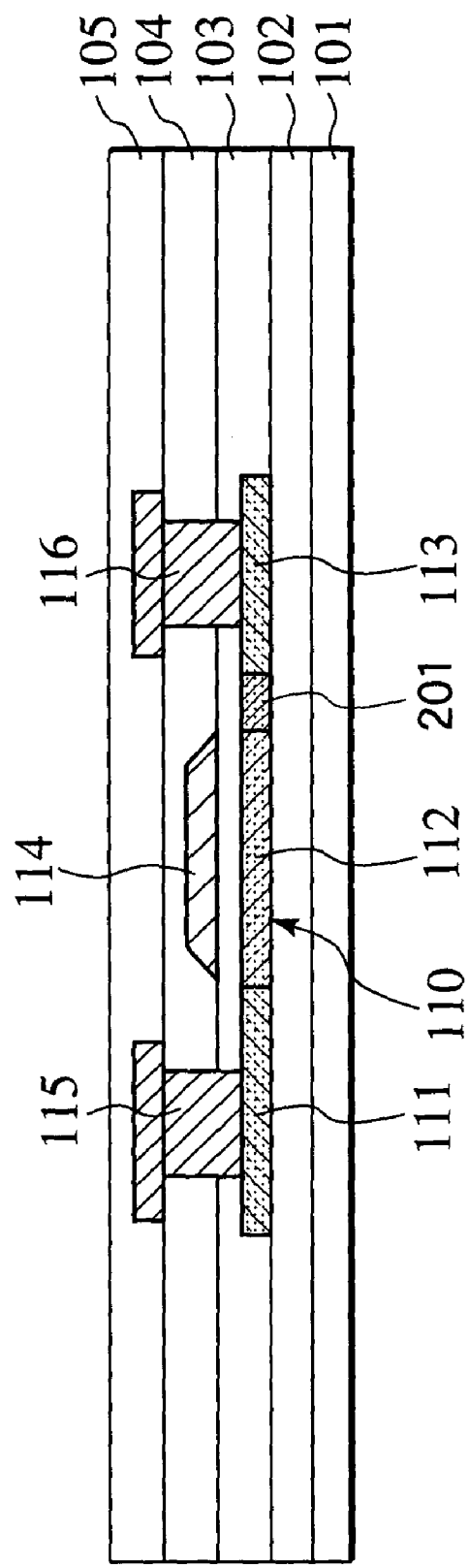
FIG. 18 is a cross-sectional view showing another configuration of the optical sensor diode.

In this embodiment, as the optical sensor diode in which the gate electrode 114 is provided, one which has the cross-section structure shown in FIG. 14 is used. However, the optical sensor diode is not limited thereto. For example, as shown in a cross-sectional view of FIG. 18, it is also satisfactory to use an optical sensor diode including an n region 201 to which phosphorous is injected at a low concentration of about $1\times10^{17}$ atm/cm$^3$ between the i region 112 and the n region 113.

The semiconductor layer 110 in this case is formed by disposing the p region 111 to which boron is injected at a high concentration, the i region 112 including hardly any impurities, the n region 201 to which phosphorous is injected at a low concentration and the n region 113 to which phosphorous is injected at a high concentration, adjacently to each other in this order. Also in this case, the current-voltage characteristics shown in FIG. 17 are obtained similarly to the above case and the leakage current can be prevented from flowing into the optical sensor diode to which no bias voltage is applied even in the state where light is being irradiated. Note that, in FIG. 18, the same constituent components as those of FIG. 14 will be denoted by the same reference numerals and repetitive description will be omitted here.

The optical sensor diode described in this embodiment can be applied to the photodiodes D1 and D2 of the first embodiment.

3. Third Embodiment

Figure 19:
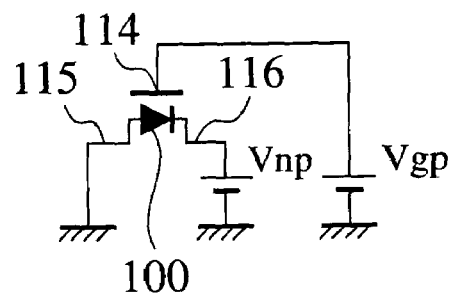
FIG. 19 is a circuit diagram showing a circuit configuration using an optical sensor diode according to a third embodiment.

As shown in the circuit diagram of FIG. 19, in a circuit configuration of a third embodiment, a bias voltage Vnp is supplied to the cathode electrode 116 of the optical sensor diode 100 and a gate voltage Vgp is supplied to the gate electrode 114. The anode electrode 115 is connected to ground.

Figure 20:
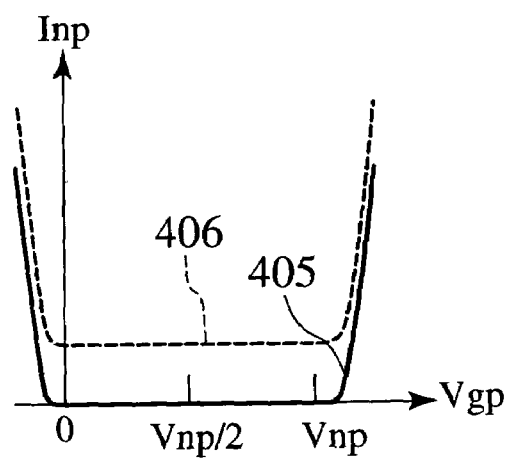
FIG. 20 is a graph showing current-voltage characteristics of the optical sensor diode when a fixed voltage is applied as a gate voltage Vgp in the circuit diagram shown in FIG. 19.

The graph of FIG. 20 shows current-voltage characteristics of the optical sensor diode 100 when a fixed voltage is applied as the gate voltage Vgp in the circuit diagram shown in FIG. 19. This graph shows a characteristic 405 in the case of irradiating no light onto the optical sensor diode 100 and a characteristic 406 in the case of irradiating light. This graph shows a good characteristic in which a current ratio of a current at the time of irradiating light (hereinafter referred to as an "irradiation current") to a current at the time of no irradiation (hereinafter referred to as a "non-irradiation current"), which is irradiation current/non-irradiation current, reaches double digits or more within the range of $0 \leq Vgp \leq Vnp$. Particularly, the graph shows the maximum current ratio at Vgp=Vnp/2. A circuit configuration in consideration of these characteristics will be described below.

Figure 21:
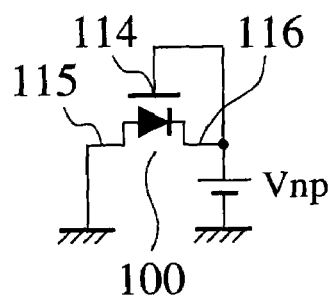
FIG. 21 is a circuit diagram showing still another circuit configuration using the foregoing optical sensor diode.

In a circuit diagram of FIG. 21, the gate electrode 114 of the gate-controlled type optical sensor diode 100 is connected to the cathode electrode 116 and the bias voltage Vnp is supplied to both the gate electrode 114 and the cathode electrode 116. The anode electrode 115 is connected to ground. With this constitution, Vgp=Vnp is established and a good current ratio of irradiation/non-irradiation current is obtained.

Figure 22:
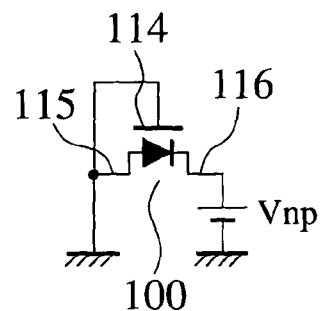
FIG. 22 is a circuit diagram showing still another circuit configuration using the foregoing optical sensor diode.

In the circuit diagram of FIG. 22, the gate electrode 114 of the gate-controlled type optical sensor diode 100 is connected to the anode electrode 115, and the gate electrode 114 and the anode electrode 115 are both connected to ground. The bias voltage Vnp is supplied to the cathode electrode 116. With this constitution, Vgp=0 is established and a good current ratio of irradiation current/non-irradiation current is obtained.

Figure 23:
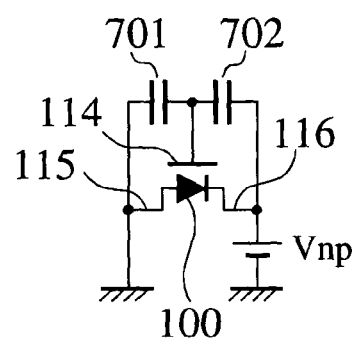
FIG. 23 is a circuit diagram showing still another circuit configuration using the foregoing optical sensor diode.

In a circuit diagram of FIG. 23, the gate electrode 114 of the gate-controlled type optical sensor diode 100 is connected to the anode electrode 115 via a first electrostatic capacity element 701. Moreover, the gate electrode 114 is connected to the cathode electrode 116 via a second electrostatic capacity element 702 having an electrostatic capacity approximately equivalent to that of the electrostatic capacity element 701. The anode electrode 115 is connected to ground and the bias voltage Vnp is supplied to the cathode electrode 116. With this constitution, Vgp=Vnp/2 is established and the best current ratio of irradiation current/non-irradiation current is obtained.

The electrostatic capacity elements are provided, respectively, between the gate electrode 114 and the anode electrode 115 and between the gate electrode 114 and the cathode electrode 116. As a result, the potential of the gate electrode 114 will always be intermediate potential between anode potential and cathode potential. Thus, there is no influence or disturbance such as that caused by an induced electromotive force of a peripheral wiring, static electricity or surface charges, and as such, the resistance never changes greatly and an amount of light can be detected stably and accurately.

Figure 24:
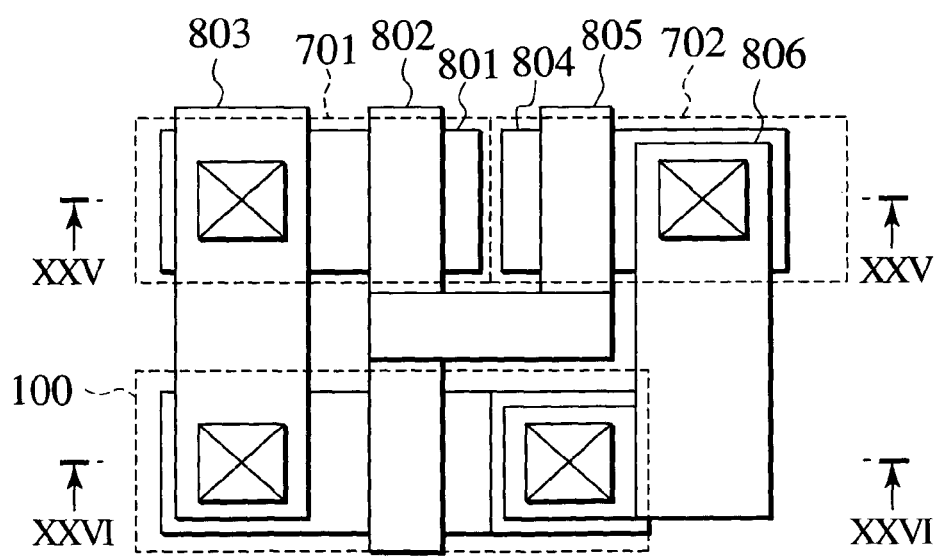
FIG. 24 is a plan view showing a structure of the circuit shown in FIG. 23.
Figure 25:
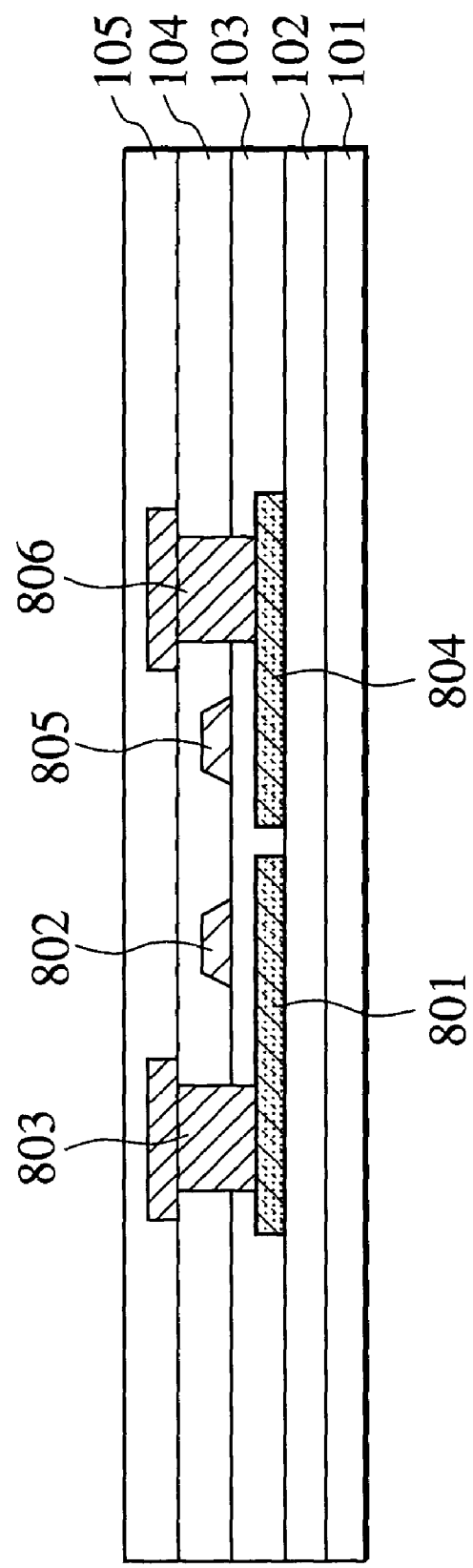
FIG. 25 is a cross-sectional view of XXV-XXV portion in FIG. 24.
Figure 26:
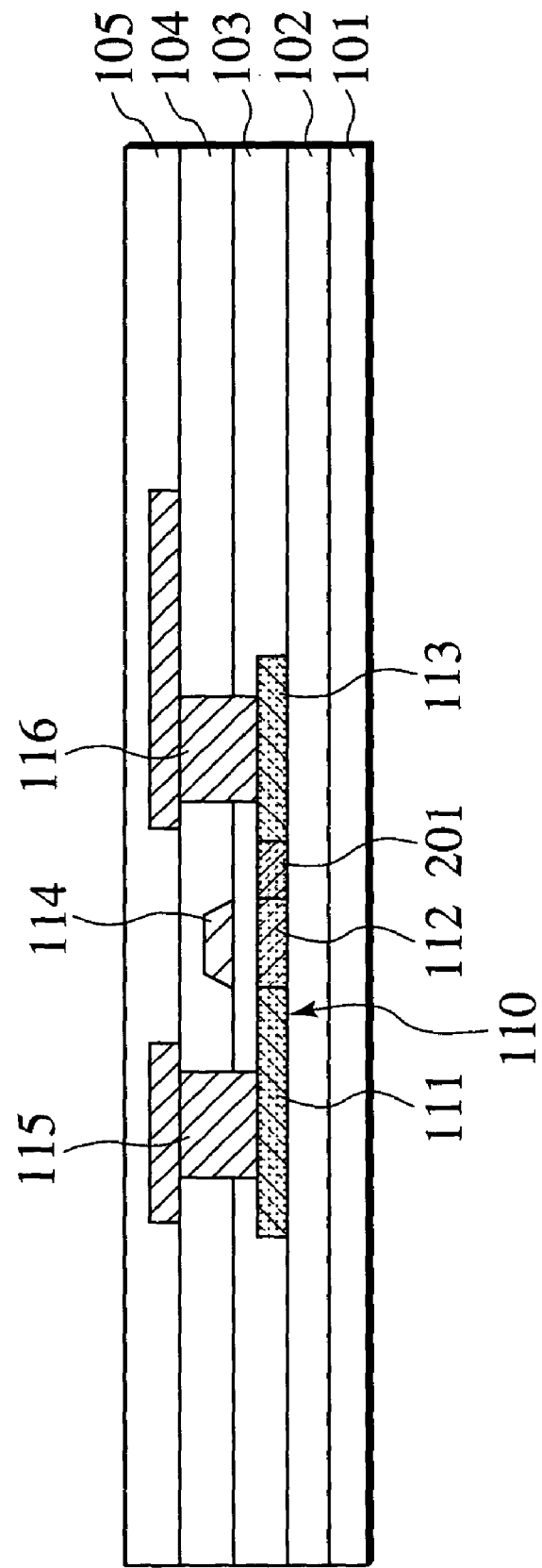
FIG. 26 is a cross-sectional view of XXVI-XXVI portion in FIG. 24.

A structure of the electrostatic capacity elements 701 and 702 shown in FIG. 23 will be described below with reference to the plan view of FIG. 24, FIGS. 25 and 26. FIG. 25 is a cross-sectional view of the XXV-XXV portion in FIG. 24 in which the electrostatic capacity elements 701 and 702 are disposed. FIG. 26 is a cross-sectional view of the XXVI-XXVI portion in FIG. 24 in which the optical sensor diode 100 is disposed and basically shows a constitution similar to the cross section of the optical sensor diode shown in FIG. 18.

As shown in FIG. 25, a silicon film 102 is formed so as to have a thickness of about 150 nm on an insulating substrate 101 by plasma CVD. On the silicon film 102, separated polysilicon films 801 and 804 are formed so as to have a thickness of about 50 nm, respectively. Boron or phosphorous is injected to the polysilicon films 801 and 804 at a high concentration of about $1\times10^{19}$ atm/cm$^3$. On the silicon film 102, a silicon oxide film 103 is further formed so as to have a thickness of about 50 to 100 nm. On the silicon oxide film 103, upper electrodes 802 and 805 made of molybdenum tungsten alloy are formed so as to have a thickness of about 300 nm, respectively, at positions above the polysilicon films 801 and 804, respectively. In this state, a silicon oxide film 104 is further formed on the silicon oxide film 103. On the silicon oxide film 104, draw-out electrodes 803 and 806 having about 600 nm-thick tip portions, which are made of molybdenum and an aluminum lamination film, are formed at positions corresponding to the polysilicon films 801 and 804, respectively. Main body portions of the draw-out electrodes 803 and 806 are formed so as to contact with the polysilicon films 801 and 804, respectively, via contact holes pierced in the silicon oxide films 103 and 104. On the silicon oxide film 104, a silicon nitride film 105 is formed.

The polysilicon films 801 and 804 are formed in the same layer as a semiconductor layer 110 shown in FIG. 26 and impurities are injected thereto at a concentration equivalent to the p region 111 and the n region 113. The upper electrodes 802 and 805 are formed in common with the gate electrode 114 shown in FIG. 26. The draw-out electrode 803 is formed in common with the anode electrode 115 and the draw-out electrode 806 is formed in common with the cathode electrode 116.

As described above, the electrostatic capacity element 701 is formed by use of the portion where the upper electrode 802 overlaps the polysilicon film 801 and the electrostatic capacity element 702 is formed by use of the portion where the upper electrode 805 overlaps the polysilicon film 804. Thus the electrostatic capacity elements 701 and 702 can be formed simultaneously at the time of forming the optical sensor diode 100.

Figure 27:
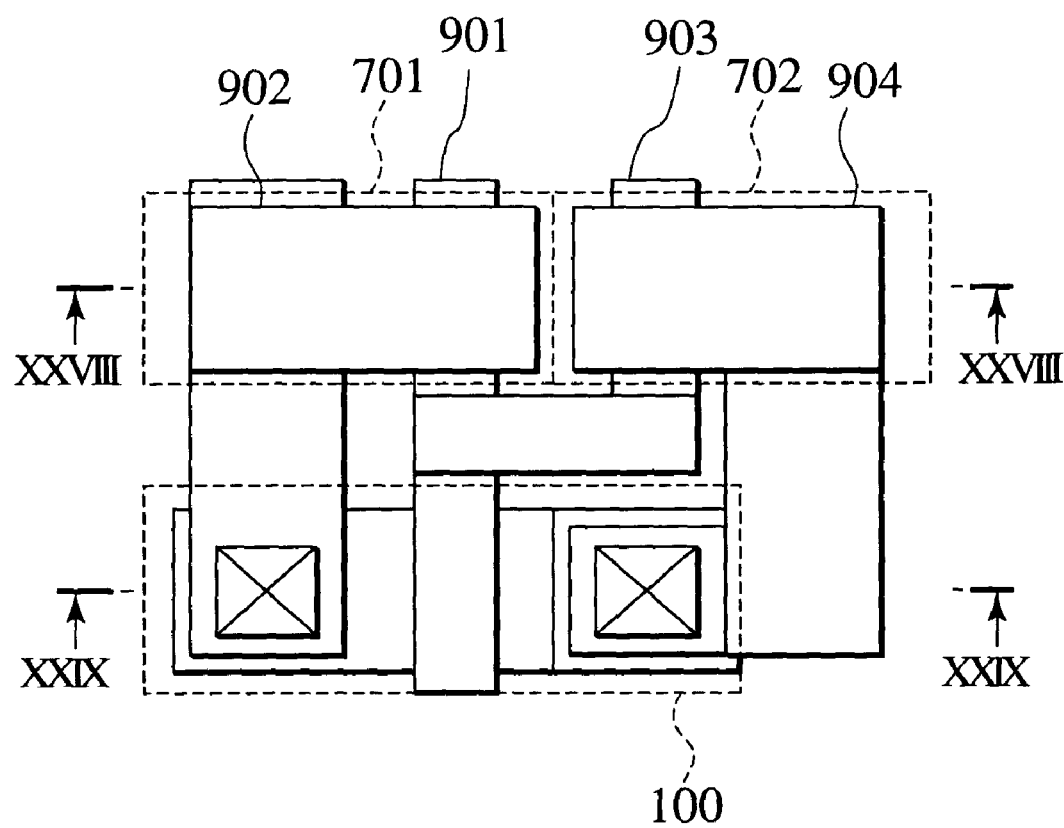
FIG. 27 is a plan view showing another structure of the circuit shown in FIG. 23.
Figure 28:
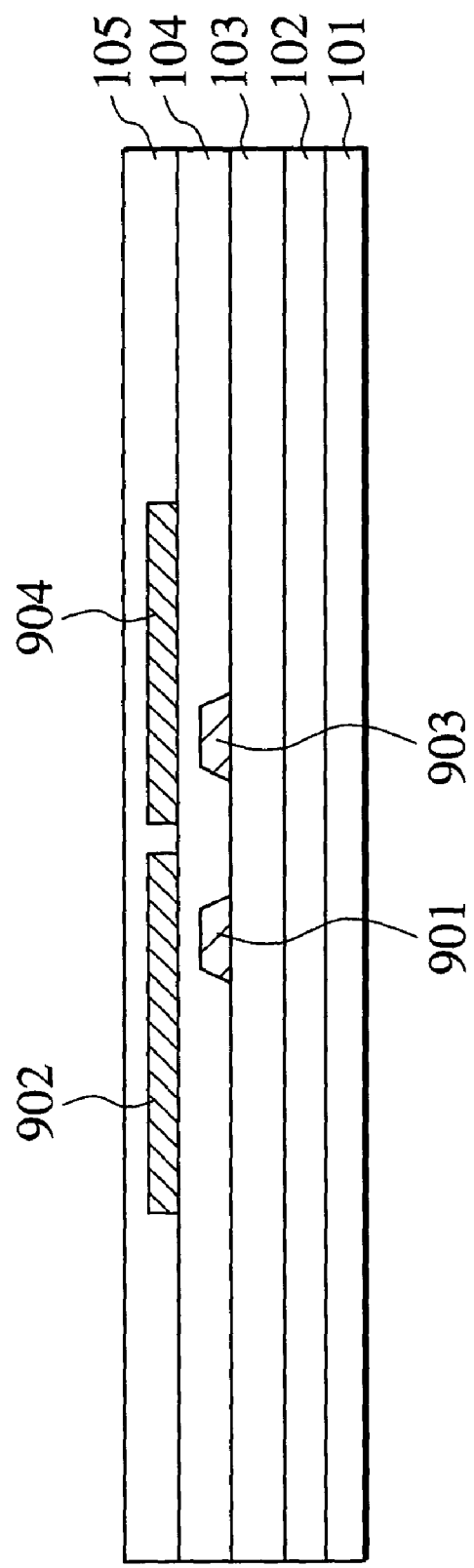
FIG. 28 is a cross-sectional view of XXVIII-XXVIII portion in FIG. 27.
Figure 29:
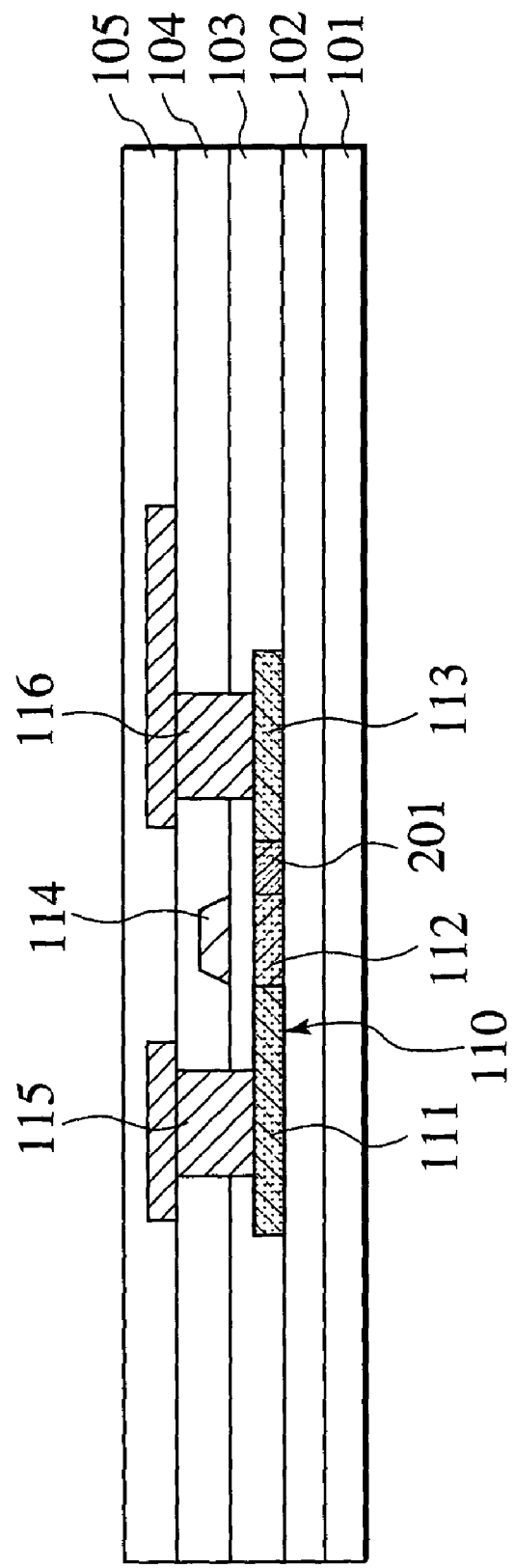
FIG. 29 is a cross-sectional view of XXIX-XXIX portion in FIG. 27.

Next, another structure of the circuit shown in FIG. 23 will be described with reference to the plan view of FIG. 27, FIGS. 28 and 29. FIG. 28 is a cross-sectional view of the XXVIII-XXVIII portion in FIG. 27 in which the electrostatic capacity elements 701 and 702 are disposed. FIG. 29 is a cross-sectional view of the XXIX-XXIX portion in FIG. 27 in which the optical sensor diode 100 is disposed and basically shows a constitution similar to the cross section of the optical sensor diode shown in FIG. 18.

As shown in FIG. 28, a silicon film 102 is formed so as to have a thickness of about 150 nm on an insulating substrate 101 by plasma CVD. On the silicon film 102, a silicon oxide film 103 is formed so as to have a thickness of about 50 to 100 nm. On the silicon oxide film 103, lower electrodes 901 and 903 made of molybdenum tungsten alloy are formed so as to have a thickness of about 300 nm, respectively. A silicon oxide film 104 is further formed on the silicon oxide film 103. On the silicon oxide film 104, draw-out electrodes 902 and 904 made of molybdenum and an aluminum lamination film are formed so as to have a thickness of about 600 nm above the lower electrodes 901 and 903, respectively. In this state, a silicon nitride film 105 is further formed on the silicon oxide film 104.

The lower electrodes 901 and 903 are formed in common with the gate electrode 114 shown in FIG. 29. The draw-out electrode 902 is formed in common with the anode electrode 115 and the draw-out electrode 904 is formed in common with the cathode electrode 116.

As described above, the electrostatic capacity element 701 is formed by use of the portion where the draw-out electrode 902 overlaps the lower electrode 901 and the electrostatic capacity element 702 is formed by use of the portion where the draw-out electrode 904 overlaps the lower electrode 903. Thus the electrostatic capacity elements 701 and 702 can be formed simultaneously at the time of forming the optical sensor diode 100.

Figure 30:
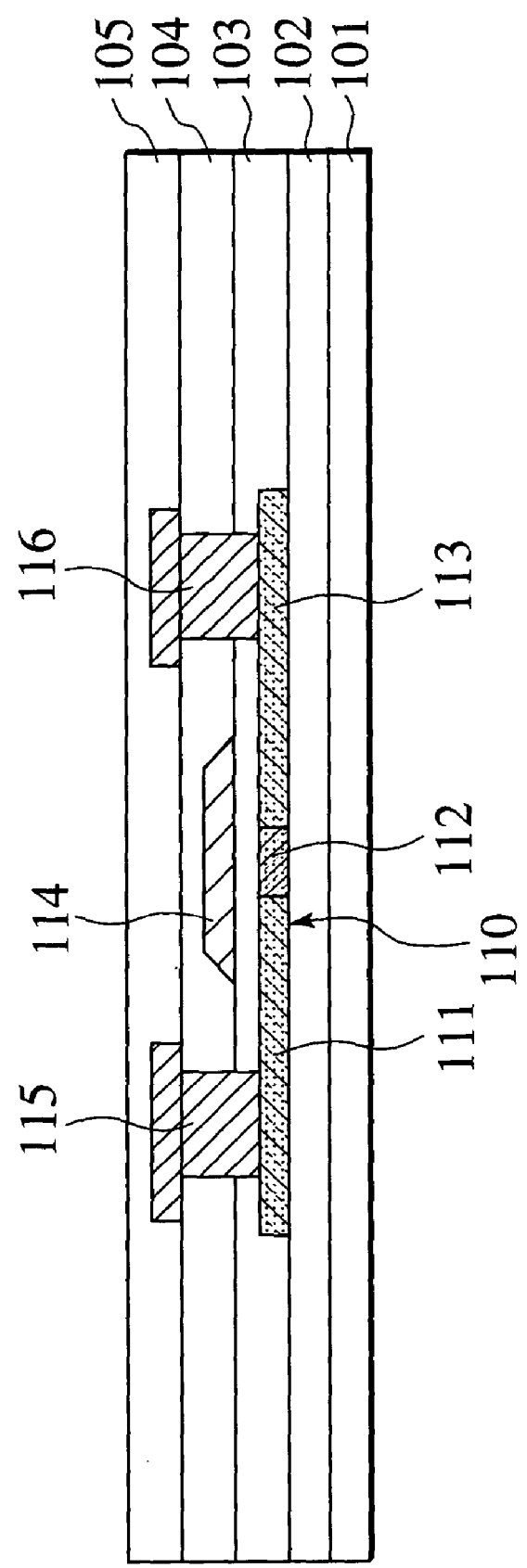
FIG. 30 is a cross-sectional view of an electrostatic capacity portion, which shows still another structure of the circuit shown in FIG. 23.

FIG. 30 is a cross-sectional view showing still another structure of the circuit shown in FIG. 23. A basic structure is approximately the same as that shown in the cross-sectional view of FIG. 14. However, in FIG. 30, the gate electrode 114 is formed so as to overlap both the p region 111 and the n region 113. The portion where the gate electrode 114 overlaps the p region 111 forms the electrostatic capacity element 701 and the portion where the gate electrode 114 overlaps the n region 113 forms the electrostatic capacity element 702. Note that the same constituent components as those of FIG. 14 are denoted by the same reference numerals and repetitive description will be omitted here.

Figure 31:
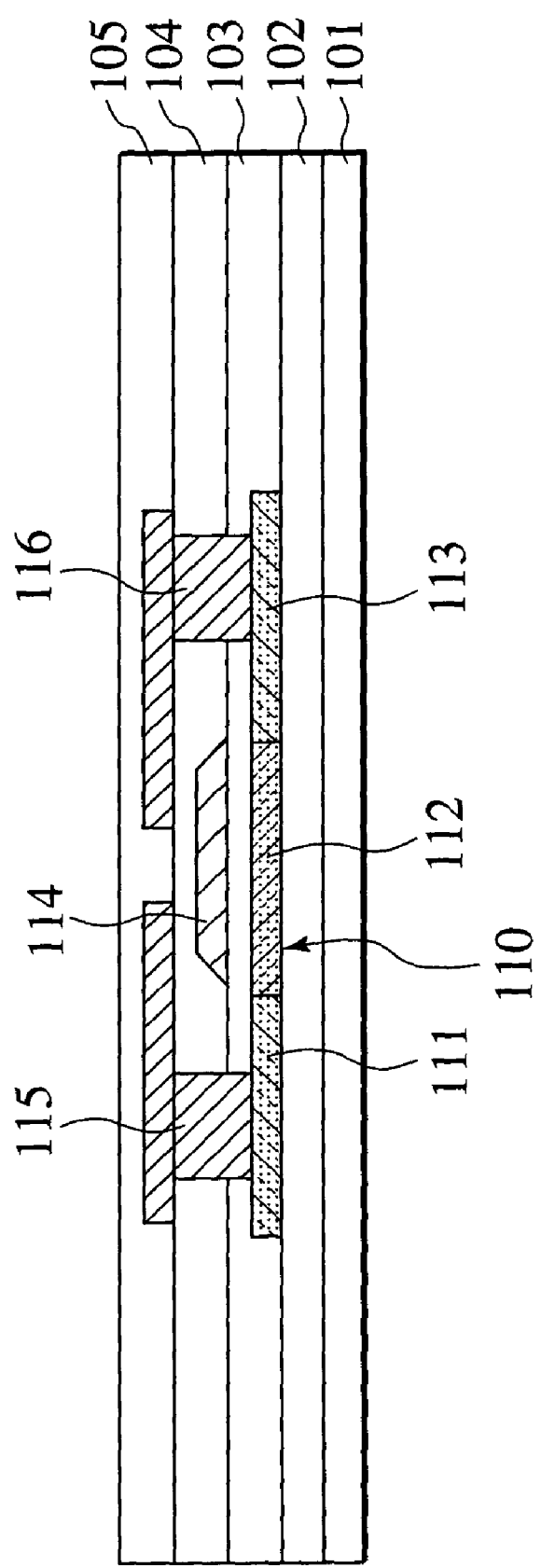
FIG. 31 is a cross-sectional view of an electrostatic capacity portion, which shows still another structure of the circuit shown in FIG. 23.

Next, still another structure of the circuit shown in FIG. 23 will be described by use of the cross-sectional view of FIG. 31. In FIG. 31, on the silicon oxide film 104, the anode electrodes 115 and the cathode electrodes 116 are formed so as to overlap the gate electrode 114, respectively. The portion where the anode electrode 115 overlaps the gate electrode 114 forms the electrostatic capacity element 701 and the portion where the cathode electrode 116 overlaps the gate electrode 114 forms the electrostatic capacity element 702. Note that the same constituent components as those of FIG. 14 are denoted by the same reference numerals and repetitive description will be omitted here.

With the structure shown in FIG. 30 or FIG. 31, the electrostatic capacity elements 701 and 702 can be formed simultaneously at the time of forming the optical sensor diode 100.

Therefore, according to this embodiment, as shown in FIG. 21, the gate electrode 114 is connected to the cathode electrode 116 and thus the gate voltage Vgp becomes equal to the bias voltage Vnp. Consequently, the good current ratio of irradiation current/non-irradiation current can be obtained.

According to this embodiment, as shown in FIG. 22, the gate electrode 114 is connected to the anode electrode 115 and thus the good current ratio of irradiation current/non-irradiation current can be obtained.

According to this embodiment, as shown in FIG. 23, the first electrostatic capacity element 701 is formed between the gate electrode 114 and the anode electrode 115, the second electrostatic capacity element 702 is formed between the gate electrode 114 and the cathode electrode 116. As a result, the gate voltage Vgp becomes half of the bias voltage Vnp. Thus, the best current ratio of irradiation current/non-irradiation current can be obtained.

According to this embodiment, as shown in FIG. 25, the first electrostatic capacity element 701 is formed of the overlapped portion between the polysilicon film 801 in the same layer as the semiconductor layer 110 and the upper electrode 802 common to the gate electrode 114, which is formed over the polysilicon film 801. Moreover, the second electrostatic capacity element 702 is formed of the overlapped portion between the polysilicon film 804 in the same layer as the semiconductor layer 110 and the upper electrode 805 common to the gate electrode 114, which is formed above the polysilicon film 804. Thus, the electrostatic capacity elements 701 and 702 can be formed simultaneously at the time of forming the optical sensor diode 100.

According to this embodiment, as shown in FIG. 28, the first electrostatic capacity element 701 is formed of the overlapped portion between the lower electrode 901 common to the gate electrode 114 and the draw-out electrode 902 common to the anode electrode, which is provided above the lower electrode 901. Moreover, the second electrostatic capacity element 702 is formed of the overlapped portion between the lower electrode 903 common to the gate electrode 114 and the draw-out electrode 904 common to the cathode electrode, which is provided above the lower electrode 903. Thus, the electrostatic capacity elements 701 and 702 can be formed simultaneously at the time of forming the optical sensor diode 100.

According to this embodiment, as shown in FIG. 30, the first electrostatic capacity element 701 is formed of the overlapped portion between the p region 111 and the gate electrode 114 formed so as to overlap with the p region 111. Moreover, the second electrostatic capacity element 702 is formed of the overlapped portion between the n region 113 and the gate electrode 114 formed so as to overlap with the n region 113. Thus, the electrostatic capacity elements 701 and 702 can be formed simultaneously at the time of forming the optical sensor diode 100.

According to this embodiment, as shown in FIG. 31, the first electrostatic capacity element 701 is formed of the overlapped portion between the gate electrode 114 and the anode electrode 115 formed so as to overlap with the gate electrode 114. Moreover, the second electrostatic capacity element 702 is formed of the overlapped portion between the gate electrode 114 and the cathode electrode 116 formed so as to overlap with the gate electrode 114. Thus, the electrostatic capacity elements 701 and 702 can be formed simultaneously at the time of forming the optical sensor diode 100.

The optical sensor diode described in this embodiment can be applied to the photodiodes D1 and D2 described in the first embodiment.

4. Fourth Embodiment

Figure 32:
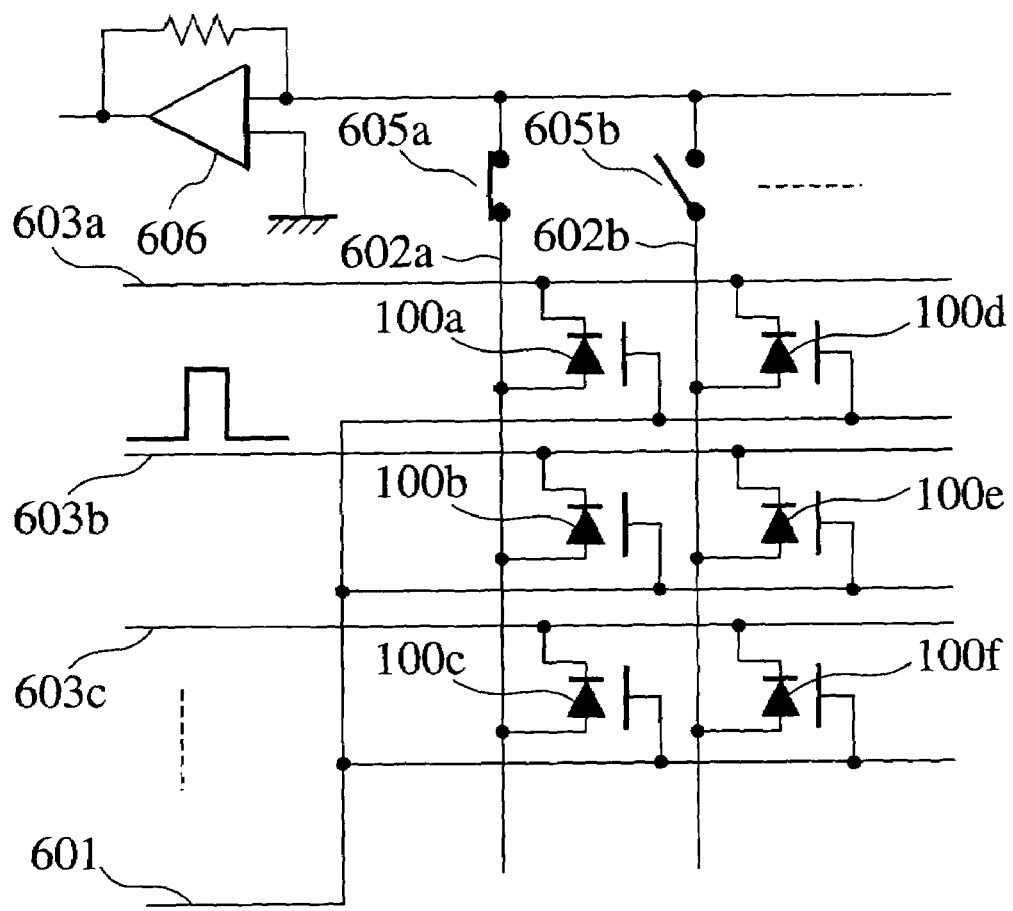
FIG. 32 is a circuit diagram showing a configuration of an image acquisition circuit using an optical sensor diode according to a fourth embodiment.

In a fourth embodiment, description will be given of an image acquisition circuit to which the optical sensor diodes of the second and third embodiments are applicable. In the image acquisition circuit of FIG. 32, a plurality of signal lines 602a, 602b ... and a plurality of selective lines 603a, 603b ... are installed on a glass insulating substrate so as to intersect with each other. At the respective intersections thereof, optical sensor diodes 100a, 100b ... are disposed one by one. The signal lines 602a, 602b ... are connected to a current amplifier 606 via respective selection switches 605a, 605b ....

Wiring of the respective optical sensor diodes 100 is based on the circuit configuration shown in FIG. 15. Specifically, a cathode terminal is connected to the selective line 603 corresponding to a certain diode, an anode terminal is connected to the signal line 602 corresponding to the diode and a gate terminal is connected to a common control line 601 common among all the diodes. For example, in the optical sensor diode 100b, the cathode terminal is connected to the selective line 603b and the anode terminal is connected to the signal line 602a.

Next, a driving method of the image acquisition circuit of this embodiment will be described. First, the potential of all the selective lines 603 is set to 0V and a reverse bias voltage of 3V, for example, is applied to the common control line 601. Accordingly, in all the optical sensor diodes 100, absolutely no current flows until a reverse bias voltage of 3V or more is applied via the selective lines 603. In the case of, for example, detecting an amount of light in the optical sensor diode 100b in the state where light is being irradiated on the circuit of this embodiment, the selection switch 605a is turned on, the signal line 602a and the current amplifier 606 are connected to each other and a reverse bias voltage of, for example, about 5V is applied to the selective line 603b. In this event, a voltage larger than the gate voltage is applied between the cathode and anode of the optical sensor diode 100b. Thus, a current corresponding to the amount of light flows from the optical sensor diode 100b into the current amplifier 606. In this event, absolutely no leakage current flows from the other optical sensor diodes 100a and 100c connected to the signal line 602a and thus only the current from the optical sensor diode 100b can be accurately detected. In such a manner, scanning the signal lines 602 and the selective lines 603 drives the optical sensor diodes 100 at desired positions. Thus, taking out the current signals from the desired optical sensor diodes as image information performs the image acquisition.

Therefore, according to this embodiment, the cathode terminal of the gate-controlled type optical sensor diode 100 is connected to the selective line 603 of the image acquisition circuit, the anode terminal is connected to the signal line 602 and the gate electrode is connected to the common control line 601. Thus, a voltage applied to the gate electrode through the common control line 601 can control a threshold of a bias voltage when a current starts to flow into the optical sensor diode. In addition, a leakage current can be prevented from flowing into an optical sensor diode to which no bias voltage higher than the gate voltage is applied even in the state where light is being irradiated. Consequently, the image acquisition can be performed with higher accuracy.

According to this embodiment, the threshold of the bias voltage when the current starts to flow is determined by applying a fixed voltage to the gate electrodes of all the optical sensor diodes 100 through the common control line 601. The selective switch 605 of the signal line 602 connected to the optical sensor diode of which the light amount is to be detected is turned on, a bias voltage larger than the voltage applied to the gate electrode is applied to the selective line 603 to which the optical sensor diode of which the light amount is to be detected is connected and thus only the current from the optical sensor diode flows into the signal line 602. Consequently, the image acquisition can be performed with high accuracy.

Note that, in this embodiment, the cathode terminal of each of the optical sensor diodes 100 is connected to the selective line 603 and the anode terminal is connected to the signal line 602. However, the anode terminal may be connected to the selective line 603 and the cathode terminal may be connected to the signal line 602.

In this embodiment, the wiring of the respective optical sensor diodes 100 is based on the circuit configuration shown in FIG. 15. However, besides the above, the wiring thereof may be based on the circuit configuration shown in FIG. 21, FIG. 22 or FIG. 23. In this case, a good current ratio of irradiation current/non-irradiation current can be obtained and the image acquisition can be performed with even higher accuracy.

The image acquisition circuit of this embodiment can be applied to the display device shown in the first embodiment.

What is claimed is:

1. An optical sensor diode, comprising:
   a semiconductor layer including a p region to which p-type impurities are injected, an n region to which n-type impurities are injected, and an i region with a lower impurity concentration than those of the p and n regions;
   an anode electrode connected to the p region;
   a cathode electrode connected to the n region;
   a gate electrode provided above the i region with an insulating film interposed therebetween;
   a first electrostatic capacity element formed between the gate electrode and the anode electrode; and
   a second electrostatic capacity element formed between the gate electrode and the cathode electrode,
   wherein the first electrostatic capacity element is formed of a polysilicon film in the same layer as the semiconductor layer and an upper electrode common to the gate electrode, which is provided so as to overlap the polysilicon film; and
   the second electrostatic capacity element is formed of a polysilicon film in the same layer as the semiconductor layer and an upper electrode common to the gate electrode, which is provided so as to overlap the polysilicon film.

2. An optical sensor diode, comprising:
   a semiconductor layer including a p region to which p-type impurities are injected, an n region to which n-type impurities are injected, and an i region with a lower impurity concentration than those of the p and n regions;
   an anode electrode connected to the p region;
   a cathode electrode connected to the n region;
   a gate electrode provided above the i region with an insulating film interposed therebetween;
   a first electrostatic capacity element formed between the gate electrode and the anode electrode; and
   a second electrostatic capacity element formed between the gate electrode and the cathode electrode,
   wherein the first electrostatic capacity element is formed of a lower electrode common to the gate electrode and a draw-out electrode common to the anode electrode, which is provided so as to overlap the lower electrode; and
   the second electrostatic capacity element is formed of a lower electrode common to the gate electrode and a draw-out electrode common to the cathode electrode, which is provided so as to overlap the lower electrode.

3. An optical sensor diode, comprising:
   a semiconductor layer including a p region to which p-type impurities are injected, an n region to which n-type impurities are injected, and an i region with a lower impurity concentration than those of the p and n regions;
   an anode electrode connected to the p region;
   a cathode electrode connected to the n region;
   a gate electrode provided above the i region with an insulating film interposed therebetween;
   a first electrostatic capacity element formed between the gate electrode and the anode electrode; and
   a second electrostatic capacity element formed between the gate electrode and the cathode electrode,
   wherein the first electrostatic capacity element is formed of the p region and a gate electrode formed so as to overlap the p region, and
   the second electrostatic capacity element is formed of the n region and a gate electrode formed so as to overlap the n region.

4. An optical sensor diode, comprising:
   a semiconductor layer including a p region to which p-type impurities are injected, an n region to which n-type impurities are injected, and an i region with a lower impurity concentration than those of the p and n regions;
   an anode electrode connected to the p region;
   a cathode electrode connected to the n region;
   a gate electrode provided above the i region with an insulating film interposed therebetween;
   a first electrostatic capacity element formed between the gate electrode and the anode electrode; and
   a second electrostatic capacity element formed between the gate electrode and the cathode electrode,
   wherein the first electrostatic capacity element is formed of the gate electrode and an anode electrode formed so as to overlap the gate electrode, and
   the second electrostatic capacity element is formed of the gate electrode and a cathode electrode formed so as to overlap the gate electrode.

5. An image acquisition circuit, comprising:
   a plurality of signal lines installed on a glass insulating substrate;
   a plurality of selective lines installed so as to intersect with the signal lines;
   a common control line installed corresponding to each of the selective lines;
   selection switches provided for the respective signal lines; and
   gate-controlled type optical sensor diodes provided at the respective intersections of the signal lines and the selective lines, in which from an anode electrode and a cathode electrode, one is selected to be connected to the signal line, and the other one is connected to the selective line, and a gate electrode is connected to the common control line.

6. A method for driving an image acquisition circuit which has a plurality of signal lines installed on a glass insulating substrate, a plurality of selective lines installed so as to intersect with the signal lines, a common control line installed corresponding to each of the selective lines, selection switches provided for the respective signal lines and gate-controlled type optical sensor diodes provided at the respective intersections of the signal lines and the selective lines, in which from an anode electrode and a cathode electrode, one is selected to be connected to the signal line, and the other one is connected to the selective line, and a gate electrode is connected to the common control line, the method comprising the steps of:

applying a fixed voltage to the common control line;

turning on a selection switch of a signal line to which an optical sensor diode for detecting the amount of light is connected; and applying a voltage larger than the fixed voltage to a selective line to which the optical sensor diode for detecting the amount of light is connected.

* * * * *